(12) United States Patent
Chae

(10) Patent No.: US 12,100,694 B2
(45) Date of Patent: Sep. 24, 2024

(54) LIGHT EMITTING DEVICE AND DISPLAY APPARATUS HAVING THE SAME

(71) Applicant: SEOUL VIOSYS CO., LTD., Ansan-si (KR)

(72) Inventor: Jong Hyeon Chae, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 18/132,942

(22) Filed: Apr. 10, 2023

(65) Prior Publication Data

US 2023/0246007 A1   Aug. 3, 2023

Related U.S. Application Data

(63) Continuation of application No. 17/149,731, filed on Jan. 15, 2021, now Pat. No. 11,626,391.

(60) Provisional application No. 62/964,364, filed on Jan. 22, 2020.

(51) Int. Cl.
  *H01L 25/075* (2006.01)
  *H01L 33/62* (2010.01)

(52) U.S. Cl.
  CPC .......... *H01L 25/0756* (2013.01); *H01L 33/62* (2013.01)

(58) Field of Classification Search
  CPC ... H01L 25/0756; H01L 33/62; H01L 25/117; H01L 33/387; H01L 33/38
  See application file for complete search history.

(56) References Cited

U.S. PATENT DOCUMENTS

| 7,319,241 B2 | 1/2008 | Park |
| 10,784,240 B2 | 9/2020 | Jang et al. |
| 2008/0308921 A1 | 12/2008 | Kim |

(Continued)

FOREIGN PATENT DOCUMENTS

| CN | 110678985 | 1/2020 |
| KR | 10-2005-0054307 | 6/2005 |

(Continued)

OTHER PUBLICATIONS

International Search Report dated May 6, 2021, issued to PCT/KR2021/00066 (with English Translation).

(Continued)

*Primary Examiner* — Latanya N Crawford Eason
(74) *Attorney, Agent, or Firm* — Oblon, McClelland, Maier & Neustadt, L.L.P.

(57) ABSTRACT

A light emitting device including an insulation unit, a light emitting region including first, second, and third LED stacks each including first and second conductivity type semiconductor layers, a first pillar electrically connected to the first conductivity type semiconductor layers of the first, second, and third LED stacks, and a second pillar, a third pillar, and a fourth pillar electrically connected to the second conductivity type semiconductor layers of the first, second, and third LED stacks, respectively, an intermediate first connector and a lower first connector respectively electrically connecting the first conductivity type semiconductor layers of the second LED stack and the third LED stack to the first pillar, in which the insulation unit have four corners, and the first, second, third, and fourth pillars are disposed near the four corners covering a side surface of the insulation unit, respectively.

20 Claims, 44 Drawing Sheets

(56) References Cited

U.S. PATENT DOCUMENTS

| | | | |
|---|---|---|---|
| 2010/0051975 A1* | 3/2010 | Suzuki | H01L 25/0756 |
| | | | 257/E33.056 |
| 2015/0014860 A1 | 1/2015 | Jang et al. | |
| 2015/0228625 A1 | 8/2015 | Lim et al. | |
| 2019/0165038 A1 | 5/2019 | Chae et al. | |
| 2019/0165207 A1 | 5/2019 | Kim et al. | |

FOREIGN PATENT DOCUMENTS

| | | |
|---|---|---|
| KR | 10-2008-0111431 | 12/2008 |
| KR | 10-2015-0094185 | 8/2015 |

OTHER PUBLICATIONS

Non-Final Office Action mailed Apr. 14, 2022, in U.S. Appl. No. 17/149,731.
Final Office Action mailed Nov. 23, 2022, in U.S. Appl. No. 17/149,731.
Notice of Allowance issued Feb. 28, 2023, in U.S. Appl. No. 17/149,731.

* cited by examiner

LIGHT EMITTING DEVICE AND DISPLAY APPARATUS HAVING THE SAME

CROSS-REFERENCE TO RELATED APPLICATIONS

This application is a Continuation of U.S. application Ser. No. 17/149,731, filed on Jan. 15, 2021, which claims the benefit of U.S. Provisional Patent Application No. 62/964,364, filed on Jan. 22, 2020, each of which is hereby incorporated by reference for all purposes as if fully set forth herein.

BACKGROUND

Field

Exemplary embodiments of the invention relate generally to a light emitting device and a display apparatus, and, more specifically, to a light emitting device having a stacked structure of LEDs, and a display apparatus having the same.

Discussion of the Background

As an inorganic light source, light emitting diodes have been used in various fields including displays, vehicular lamps, general lighting, and the like. With various advantages of light emitting diodes over conventional light sources, such as longer lifespan, lower power consumption, and rapid response, light emitting diodes have been replacing conventional light sources.

Light emitting diodes have been typically used as backlight light sources in display apparatuses. However, LED displays that directly display images using the light emitting diodes have been recently developed. Light emitting devices used in such LED displays are often referred to as micro LEDs.

In general, a display apparatus realizes various colors through mixture of blue, green, and red light. In order to display various images, a display apparatus includes a plurality of pixels, each including sub-pixels corresponding to blue, green, and red light, respectively. In this manner, a color of a certain pixel is determined based on the colors of the sub-pixels so that images can be displayed through combination of such pixels.

Since LEDs can emit various colors depending upon materials thereof, a display apparatus may be provided by arranging individual LED chips emitting blue, green, and red light on a two-dimensional plane. However, when one LED chip is arranged in each sub-pixel, the number of LED chips may be increased, which may require excessive time for a mounting process during manufacture. Moreover, when the sub-pixels are arranged on the two-dimensional plane in the display apparatus, a relatively large area is occupied by one pixel that includes the sub-pixels for blue, green, and red light.

As such, a light emitting device having a stacked structure of a blue LED, a green LED, and a red LED has been developed. The stacked light emitting device can implement blue light, green light, and red light with a single chip, so that the number of light emitting devices required for a display apparatus can be reduced to ⅓ of what would have been required when conventional light emitting devices are used. Accordingly, it is possible to drastically reduce a mounting process time of the light emitting devices, and also, it is possible to reduce an occurrence of defective devices after mounting.

Meanwhile, the stacked light emitting device generally includes a connection structure for connecting the LEDs to pads, such as through vias passing through the LEDs. However, the through vias typically reduces a light emitting area of the LEDs. In particular, in a light emitting device having a small size such as micro LEDs, using the via reduces a light emitting area of the micro LEDs. In this case, the effect of non-radiative surface recombination may be increased, thereby lowering an external quantum efficiency of the LED.

Moreover, the micro LEDs are being developed to have smaller sizes. For example, a display apparatus for augmented reality (AR) may require extremely small micro LEDs of 5 μm×5 μm or less, and further 3 μm×3 μm or less. Reducing the size of the micro LEDs may require reducing the size of the vias, but it is difficult to reduce the size of the vias in proportion to the reduction in size of the micro LEDs due to performance limitations of an etching equipment and a deposition equipment. Accordingly, as the size of the micro LEDs decreases, a ratio of a region occupied by the vias is increased. In this case, an emission area is further reduced, and non-radiative surface recombination may become more serious.

The above information disclosed in this Background section is only for understanding of the background of the inventive concepts, and, therefore, it may contain information that does not constitute prior art.

SUMMARY

Stacked light emitting devices constructed according to the exemplary embodiments of the invention includes a novel electrical connection structure for electrically connecting pads and LEDs, and a display apparatus having the same.

Exemplary embodiments also provide a stacked light emitting device capable of alleviating reduction in a light emitting area of a light emitting device by a connection structure electrically connecting pads and LEDs, and a display apparatus having the same.

Exemplary embodiments further provide a light emitting device capable of preventing current leakage due to non-radiative surface recombination and a display apparatus having the same.

Additional features of the inventive concepts will be set forth in the description which follows, and in part will be apparent from the description, or may be learned by practice of the inventive concepts.

A light emitting device according to an exemplary embodiment includes a first LED stack, a second LED stack disposed under the first LED stack, a third LED stack disposed under the second LED stack, and a plurality of pillars disposed adjacent to side surfaces of the first, second, and third LED stacks, the pillars including a first pillar commonly electrically connected to the first, second, and third LED stacks, and a second pillar, a third pillar, and a fourth pillar electrically connected to the first, second, and third LED stacks, respectively.

The light emitting device may further include a first bonding layer interposed between the second LED stack and the third LED stack, and a second bonding layer interposed between the first LED stack and the second LED stack.

Each of the first, second, and third LED stacks may include a first conductivity type semiconductor layer and a second conductivity type semiconductor layer, the first pillar may be commonly electrically connected to the first conductivity type semiconductor layers of the first, second, and third LED stacks, and each of the second, third, and fourth pillars may be electrically connected to the second conductivity type semiconductor layers of the first, second, and third LED stacks, respectively.

The light emitting device may further include an intermediate first connector electrically connecting the first conductivity type semiconductor layer of the second LED stack and the first pillar, an intermediate second connector electrically connecting the second conductivity type semiconductor layer of the second LED stack and the third pillar, a lower first connector electrically connecting the first conductivity type semiconductor layer of the third LED stack and the first pillar, and a lower second connector electrically connecting the second conductivity type semiconductor layer of the third LED stack and the fourth pillar.

A portion of the lower first connector and a portion of the lower second connector may be disposed under the first pillar and the fourth pillar, respectively.

The light emitting device may further include lower metal layers extending outward of the third LED stack from a region between the second LED stack and the third LED stack, in which the lower metal layers may be insulated from the third LED stack, and a portion of each of the lower metal layers may be disposed under the second and third pillars.

The light emitting device may further include intermediate metal layers extending outward of the second LED stack from a region between the first LED stack and the second LED stack, in which the intermediate metal layers may be insulated from the second LED stack.

Lowermost layers of the lower first connector, the lower second connector, and the lower metal layers may include at least one of a Cr layer and an Al layer.

The light emitting device may further include a first insulation layer covering the third LED stack, a second insulation layer covering the second LED stack, and a third insulation layer covering the first LED stack, in which the lower first connector and the lower second connector may be disposed on the first insulation layer, the intermediate first connector and the intermediate second connector may be disposed on the second insulation layer, and portions of the first, second, and third insulation layers may be disposed between the first to fourth pillars and the first to third LED stacks.

At least one of the first, second, and third LED stacks may include a mesa, and at least one of the first, second, and third insulation layers may cover a side surface of the mesa.

The light emitting device may further include first, second, third, and fourth pads electrically connected to the first, second, third, and fourth pillars, respectively, in which the first pad may electrically connect the first pillar to the first conductivity type semiconductor layer of the first LED stack, and the second pad may electrically connect the second pillar to the second conductivity type semiconductor layer of the first LED stack.

The first, second, third, and fourth pads may be disposed over the first, second, third, and fourth pillars and the first LED stack.

The first, second, and third LED stacks may be configured to emit red light, blue light, and green light, respectively.

The first, second, and third LED stacks may have a through-via free structure.

The light emitting device may have an external size of 5 μm×5 μm or less.

The first, second, and third LED stacks may have substantially a quadrangular shape in which four corners are partially removed in plan view, and the first, second, third, and fourth pillars may be disposed near the four corners, respectively.

The first, second, and third LED stacks may have substantially a quadrangular shape in which four edges of each of the first, second, and third LED stacks are partially removed in plan view, and the first, second, third, and fourth pillars may be disposed near the four edges, respectively.

A display panel according to another exemplary embodiment includes a circuit board, and a plurality of light emitting devices arranged on the circuit board, the light emitting devices including a first LED stack, a second LED stack disposed under the first LED stack, a third LED stack disposed under the second LED stack, and a plurality of pillars disposed adjacent to side surfaces of the first, second, and third LED stacks, in which the plurality of pillars includes a first pillar commonly electrically connected to the first, second, and third LED stacks, and a second pillar, a third pillar, and a fourth pillar electrically connected to the first, second, and third LED stacks, respectively.

The plurality of light emitting devices may include a first group of light emitting devices, and the first, second, and third LED stacks of each of the light emitting devices in the first group may have substantially a quadrangular shape in which four corners are partially removed in plan view, and the first, second, third, and fourth pillars may be disposed near the four corners, respectively.

The plurality of light emitting devices may further include a second group of light emitting devices, and the first, second, and third LED stacks of each of the light emitting devices in the second group may have substantially a quadrangular shape in which four edges may be partially removed in plan view, and the first, second, third, and fourth pillars may be disposed near the four edges, respectively.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
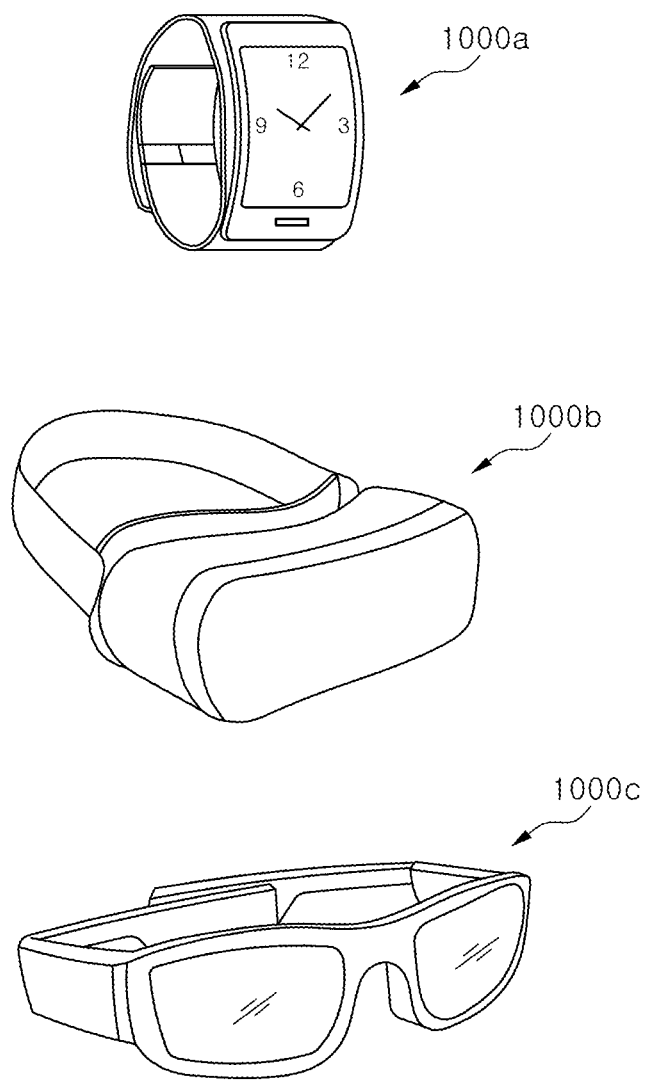
FIG. 1 shows schematic perspective views of a display apparatus according to exemplary embodiments.

In the following description, for the purposes of explanation, numerous specific details are set forth in order to provide a thorough understanding of various exemplary embodiments or implementations of the invention. As used herein "exemplary embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the exemplary embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various exemplary embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular exemplary embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the inventive concepts will be described in detail with reference to the accompanying drawings.

FIG. 1 shows schematic perspective views of a display apparatus according to exemplary embodiments.

A light emitting device according to exemplary embodiments may be used in a VR display apparatus such as a smart watch 1000a or a VR headset 1000b, or an AR display apparatus such as augmented reality glasses 1000c, without being limited thereto.

Figure 2:
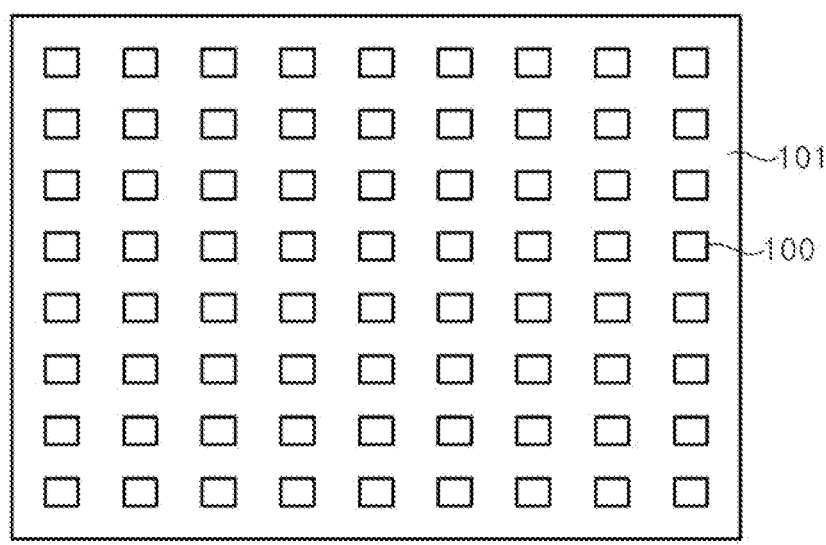
FIG. 2 is a schematic plan view of a display panel according to an exemplary embodiment.

A display panel for implementing an image is mounted on the display apparatus. FIG. 2 is a schematic plan view of a display panel according to an exemplary embodiment.

Referring to FIG. 2, the display panel includes a circuit board 101 and light emitting devices 100.

The circuit board 101 may include a circuit for passive matrix driving or active matrix driving. In an exemplary embodiment, the circuit board 101 may include interconnection lines and resistors therein. In another exemplary embodiment, the circuit board 101 may include interconnection lines, transistors, and capacitors. The circuit board 101 may also have pads disposed on an upper surface thereof to allow electrical connection to the circuit therein.

The plurality of light emitting devices 100 are arranged on the circuit board 101. The light emitting devices 100 may be arranged in various ways. Each of the light emitting device 100 may form one pixel. The light emitting device 100 may have pads thereon, and the pads may be electrically connected to the circuit board 101. For example, the pads may be bonded to pads exposed on the circuit board 101.

Figure 3:
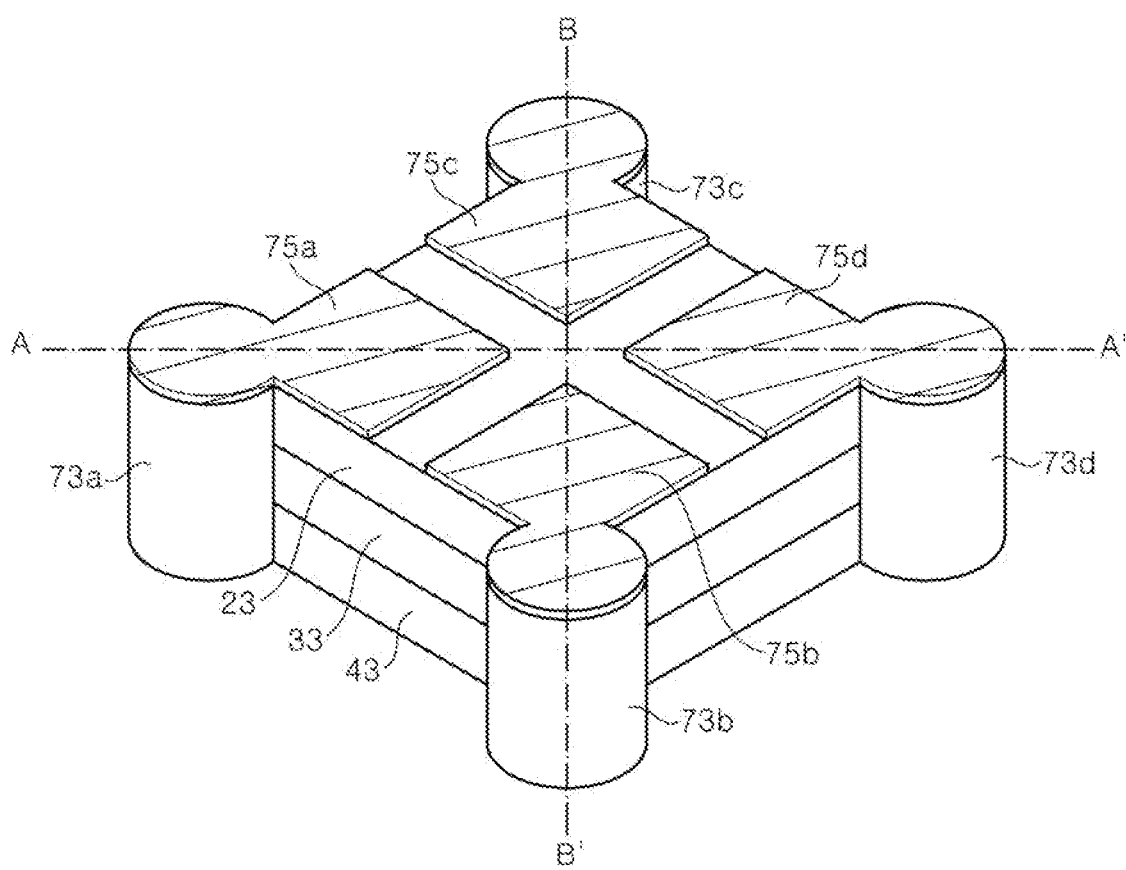
FIG. 3 is a schematic perspective view of a light emitting device according to an exemplary embodiment.

A configuration of the light emitting device 100 according to an exemplary embodiment will be described with reference to FIGS. 3, 4A, and 4B. FIG. 3 is a schematic perspective view of the light emitting device 100 according to an exemplary embodiment, and FIGS. 4A and 4B are schematic cross-sectional views taken along lines A-A' and B-B' of FIG. 3, respectively, to illustrate the light emitting device 100 according to an exemplary embodiment.

Hereinafter, although pads 75a, 75b, 75c, and 75d are exemplarily illustrated and described as being disposed at an upper side in the drawings, the inventive concepts are not limited thereto. For example, according to another exemplary embodiment, the light emitting device 100 may be flip-bonded on the circuit board 101 shown in FIG. 2, and in this case, the pads 75a, 75b, 75c, and 75d may be disposed at a lower side. In some exemplary embodiments, the pads 75a, 75b, 75c, and 75d may be omitted.

Figure 4A:
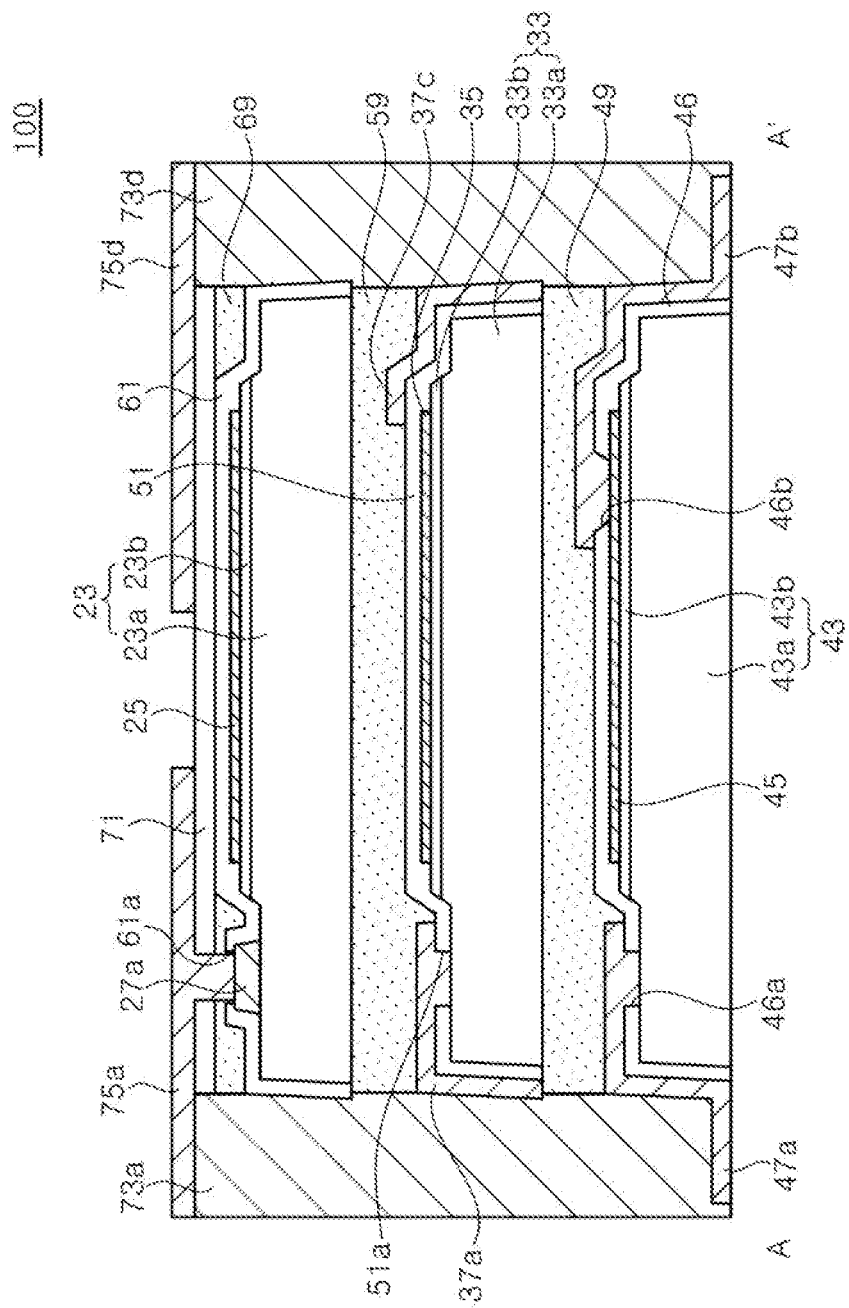
FIGS. 4A and 4B are schematic cross-sectional views taken along lines A-A' and B-B' of FIG. 3, respectively.
Figure 4B:
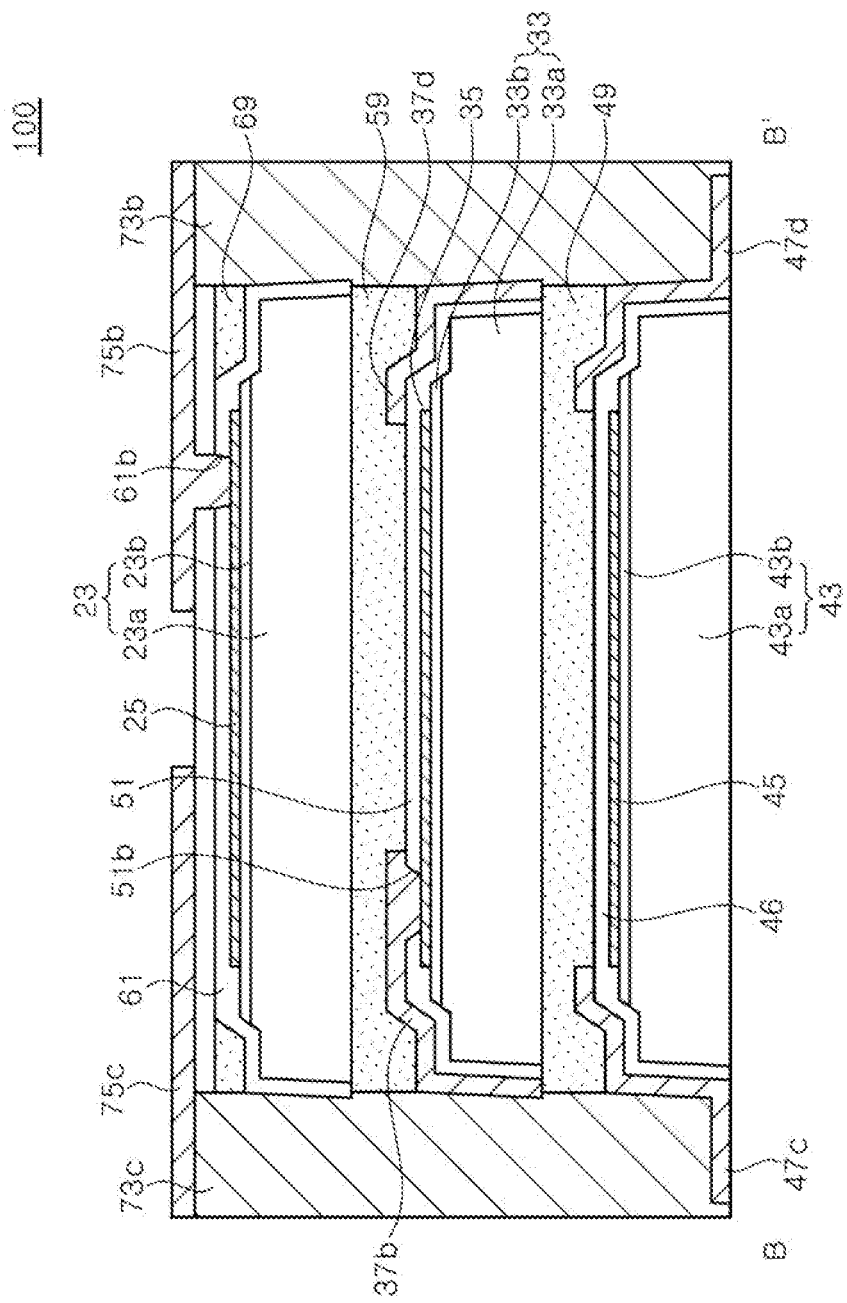

Referring to FIGS. 3, 4A, and 4B, the light emitting device 100 may include a first LED stack 23, a second LED stack 33, a third LED stack 43, a first ohmic electrode 25, a second ohmic electrode 35, a third ohmic electrode 45, an n-electrode pad 27a, an intermediate n-connector 37a, an intermediate p-connector 37b, intermediate metal layers 37c and 37d, a lower n-connector 47a, a lower p-connector 47b, lower metal layers 47c and 47d, a first bonding layer 49, a second bonding layer 59, a planarization layer 69, a first insulation layer 46, a second insulation layer 51, a third insulation layer 61, an upper insulation layer 71, a first pillar 73a, a second pillar 73b, a third pillar 73c, a fourth pillar 73d, and pads 75a, 75b, 75c, and 75d.

As shown in FIGS. 3, 4A, and 4B, the first, second, and third LED stacks 23, 33, and 43 are stacked in the vertical direction. The first, second, and third LED stacks 23, 33, and 43 may be grown on different growth substrates from each other, and according to the illustrated exemplary embodiment, each of the growth substrates may be removed from the light emitting device 100. As such, the light emitting device 100 does not include the growth substrates of the first, second, and third LED stacks 23, 33, and 43. However, the inventive concepts are not limited thereto, and in some exemplary embodiments, at least one of the growth substrates may be included in the light emitting device 100.

Each of the first LED stack 23, the second LED stack 33, and the third LED stack 43 includes a first conductivity type semiconductor layer 23a, 33a, or 43a, a second conductivity type semiconductor layer 23b, 33b, or 43b, and an active layer interposed therebetween. In particular, the active layer may have a multiple quantum well structure.

The second LED stack 33 is disposed under the first LED stack 23, and the third LED stack 43 is disposed under the second LED stack 33. Light generated in the first, second, and third LED stacks 23, 33, and 43 may be emitted to the outside through the third LED stack 43.

In an exemplary embodiment, the first LED stack 23 may emit light having a longer wavelength than that emitted from the second and third LED stacks 33 and 43, and the second LED stack 33 may emit light having a longer wavelength than that emitted from the third LED stack 43. For example, the first LED stack 23 may be an inorganic light emitting diode emitting red light, the second LED stack 33 may be an inorganic light emitting diode emitting green light, and the third LED stack 43 may be an inorganic light emitting diode emitting blue light.

In another exemplary embodiment, to adjust a color mixing ratio of light emitted from the first, second, and third LED stacks 23, 33, and 43, the second LED stack 33 may emit light having a shorter wavelength than that emitted from the third LED stack 43. As such, luminous intensity of light emitted from the second LED stack 33 may be reduced while luminous intensity of light emitted from the third LED stack 43 may not be reduced. As such, it is possible to dramatically change a luminous intensity ratio of light emitted from the first, second, and third LED stacks 23, 33, and 43. For example, the first LED stack 23 may be configured to emit red light, the second LED stack 33 may be configured to emit blue light, and the third LED stack 43 may be configured to emit green light.

Hereinafter, although the second LED stack 33 is exemplarily described as emitting light of a shorter wavelength than that emitted from the third LED stack 43, such as blue light, the inventive concepts are not limited thereto. In some exemplary embodiments, the second LED stack 33 may emit light of a longer wavelength than that emitted from the third LED stack 43.

The first LED stack 23 may include an AlGaInP-based well layer, the second LED stack 33 may include an AlGaInN-based well layer, and the third LED stack 43 may include an AlGaInP or AlGaInN-based well layer.

Since the first LED stack 23 emits light of a longer wavelength than that emitted from the second and third LED stacks 33 and 43, light generated in the first LED stack 23 may be emitted to the outside through the second and third LED stacks 33 and 43. In addition, since the second LED stack 33 emits light of a shorter wavelength than that emitted from the third LED stack 43, a portion of light generated in the second LED stack 33 may be absorbed by the third LED stack 43 and lost, and thus, luminous intensity of light generated in the second LED stack 33 may be reduced. Meanwhile, since light generated in the third LED stack 43 is emitted to the outside without passing through the first and second LED stacks 23 and 33, luminous intensity thereof may not be reduced.

In another exemplary embodiment, when the second LED stack 33 emits light of a longer wavelength compared to that emitted from the third LED stack 43, light generated from the second LED stack 33 may pass through the third LED stack 43 and be emitted to the outside, thereby reducing the loss of light generated from the second LED stack 33.

The first conductivity type semiconductor layer 23a, 33a or 43a of each of the LED stacks 23, 33, and 43 may be an n-type semiconductor layer, and the second conductivity type semiconductor layer 23b, 33b or 43b thereof may be a p-type semiconductor layer. In the illustrated exemplary embodiment, an upper surface of the first LED stack 23 is a p-type semiconductor layer 23b, an upper surface of the second LED stack 33 is a p-type semiconductor layer 33b, and an upper surface of the third LED stack 43 is a p-type semiconductor layer 43b. As such, a stack sequence of the first, second, and third LED stacks 23, 33, and 43 may be all the same. However, the inventive concepts are not limited thereto, and in some exemplary embodiments, the stack sequence of any one of these LED stacks 23, 33, and 43 may be different from other LED stacks. In addition, in other exemplary embodiments, the first conductivity type semiconductor layer 23a, 33a or 43a of each of the LED stacks 23, 33, and 43 may be a p-type semiconductor layer, and the second conductivity type semiconductor layer 23b, 33b or 43b thereof may be an n-type semiconductor layer.

In an exemplary embodiment, the first LED stack 23 may include a mesa etching region in which the second conductivity type semiconductor layer 23b is removed to expose an upper surface of the first conductivity type semiconductor layer 23a. A mesa including the second conductivity type semiconductor layer 23b and an active layer may be disposed on a partial region of the first conductivity type semiconductor layer 23a by the mesa etching region. The upper surface of the first conductivity type semiconductor layer 23a may be exposed around the mesa. Further, the mesa may be disposed inside of a region surrounded by an edge of the first conductivity type semiconductor layer 23a. Meanwhile, as shown in FIG. 4A, the n-electrode pad 27a may be disposed on the first conductivity type semiconductor layer 23a exposed by the mesa etching region.

The second LED stack 33 may include a mesa etching region in which the second conductivity type semiconductor layer 33b is removed to expose an upper surface of the first conductivity type semiconductor layer 33a. A mesa including the second conductivity type semiconductor layer 33b and an active layer may be disposed on a partial region of the first conductivity type semiconductor layer 33a by the mesa etching region. The upper surface of the first conductivity type semiconductor layer 33a may be exposed around the mesa. Further, the mesa may be disposed inside of a region surrounded by an edge of the first conductivity type semiconductor layer 33a. Meanwhile, as shown in FIG. 4A, the intermediate n-connector 37a may be electrically connected onto the first conductivity type semiconductor layer 33a exposed by the mesa etching region.

The third LED stack 43 may also include a mesa etching region exposing an upper surface of the first conductivity type semiconductor layer 43a by removing the second conductivity type semiconductor layer 43b, and a mesa including the second conductivity type semiconductor layer 43b and an active layer may be disposed on a partial region of the first conductivity type semiconductor layer 43a by the mesa etching region. In addition, the upper surface of the first conductivity type semiconductor layer 43a may be exposed around the mesa. Further, the mesa may be disposed inside of a region surrounded by an edge of the first conductivity type semiconductor layer 43a. Meanwhile, as shown in FIG. 4A, the lower n-connector 47a may be electrically connected onto the first conductivity type semiconductor layer 43a exposed by the mesa etching region.

The third LED stack 43 may have a flat lower surface, but the inventive concepts are not limited thereto. For example, the third LED stack 43 may include irregularities on a surface of the first conductivity type semiconductor layer 43a, and light extraction efficiency may be improved by the irregularities. The surface irregularities of the first conductivity type semiconductor layer 43a may be formed by separating a patterned sapphire substrate therefrom, but the inventive concepts are not limited thereto. In some exemplary embodiments, the surface irregularities may be formed by texturing after separating the growth substrate. The second LED stack 33 may also have the first conductivity type semiconductor layer 33a having a textured surface.

In the illustrated exemplary embodiment, the first LED stack 23, the second LED stack 33, and the third LED stack 43 may be overlapped with one another, and may have a light emitting area of substantially similar size. In particular, since the first, second, and third LED stacks 23, 33, and 43 according to an exemplary embodiment may not include conventional through vias, the first, second, and third LED stacks 23, 33, and 43 may have similar shapes to one another. In particular, the first, second, and third LED stacks 23, 33, and 43 may have the mesa of similar shape and size. However, the inventive concepts are not limited thereto.

The first ohmic electrode 25 may be disposed on the second conductivity type semiconductor layer 23b of the first LED stack 23. The first ohmic electrode 25 is in ohmic contact with the second conductivity type semiconductor layer 23b of the first LED stack 23. The first ohmic electrode 25 may be a transparent electrode that transmits light or a reflective electrode that reflects light generated by the first LED stack 23. For example, the first ohmic electrode 25 may be formed using a transparent oxide layer such as indium tin oxide (ITO) or a metal layer.

The second ohmic electrode 35 is in ohmic contact with the second conductivity type semiconductor layer 33b of the second LED stack 33. As shown in the drawing, the second ohmic electrode 35 contacts the upper surface of the second LED stack 33 between the first LED stack 23 and the second LED stack 33. The second ohmic electrode 35 may be formed of a metal layer or a conductive oxide layer that is transparent to red light. The conductive oxide layer may include $SnO_2$, $InO_2$, ITO, ZnO, IZO, or the like. In particular, the second ohmic electrode 35 may be formed of ZnO, which may be formed as a single crystal on the second LED stack 33, and which has favorable electrical and optical characteristics as compared with the metal layer or other conductive oxide layers. Moreover, since ZnO has a strong adhesion to the second LED stack 33, reliability of the light emitting device may be improved.

The second ohmic electrode 35 may be partially removed along an edge of the second conductivity type semiconductor layer 33b of the second LED stack 33, and accordingly, an outer side surface of the second ohmic electrode 35 may be covered with the second insulation layer 51. That is, the side surface of the second ohmic electrode 35 may be recessed inwardly than that of the second conductivity type semiconductor layer 33b, and a region where the second ohmic electrode 35 is recessed may be filled with the second insulation layer 51 and/or the second bonding layer 59.

The third ohmic electrode 45 is in ohmic contact with the second conductivity type semiconductor layer 43b of the third LED stack 43. The third ohmic electrode 45 may be disposed between the second LED stack 33 and the third LED stack 43, and contacts the upper surface of the third LED stack 43. The third ohmic electrode 45 may be formed of a metal layer or a conductive oxide layer that is transparent to red light and blue light. For example, the conductive oxide layer may include $SnO_2$, $InO_2$, ITO, ZnO, IZO, or the like. In particular, the third ohmic electrode 45 may be formed of ZnO, which may be formed as a single crystal on the third LED stack 43, and which may have favorable electrical and optical characteristics as compared with the metal layer or other conductive oxide layers. In addition, since ZnO has a strong adhesion to the third LED stack 43, reliability of the light emitting device may be improved.

The third ohmic electrode 45 may be partially removed along an edge of the second conductivity type semiconductor layer 43b of the third LED stack 43. Accordingly, an outer side surface of the third ohmic electrode 45 may not be exposed to the outside, but covered with the first insulation layer 46. That is, the side surface of the third ohmic electrode 45 may be recessed inwardly than that of the third LED stack 43, and a region where the third ohmic electrode 45 is recessed may be filled with the first insulation layer 46 and/or the first bonding layer 49.

According to an exemplary embodiment, the second ohmic electrode 35 and the third ohmic electrode 45 may be formed of the same type of conductive oxide layer, for example, ZnO, and the first ohmic electrode 25 may be formed of a different type of conductive oxide layer from the second and third ohmic electrodes 35 and 45, such as ITO. However, the inventive concepts are not limited thereto, and each of the first, second, and third ohmic electrodes 25, 35, and 45 may include the same material, or at least one may include a different material.

The n-electrode pad 27a is in ohmic contact with the first conductivity type semiconductor layer 23a of the first LED stack 23. The n-electrode pad 27a may be disposed on the first conductivity type semiconductor layer 23a exposed around the mesa. The n-electrode pad 27a may include, for example, AuGe or AuTe.

The intermediate n-connector 37a is electrically connected to the first conductivity type semiconductor layer 33a of the second LED stack 33. The intermediate n-connector 37a may be connected to the first conductivity type semiconductor layer 33a through an opening 51a of the second insulation layer 51. The intermediate n-connector 37a may also extend outward of the second LED stack 33 and as shown in FIG. 4A, may partially cover a side surface of the second LED stack 33, for example.

In an exemplary embodiment, the intermediate n-connector 37a may be in ohmic contact with the first conductivity type semiconductor layer 33a exposed by mesa etching. The intermediate n-connector 37a may include a Cr layer or an Al layer for ohmic contact, and may be formed of, for example, Cr/Ti/Au/Ti or Al/Ti/Au/Ti. In another exemplary embodiment, an ohmic electrode including the Cr layer or the Al layer may be formed on the first conductivity type semiconductor layer 33a, and the intermediate n-connector 37a may be connected to the ohmic electrode.

The intermediate p-connector 37b may be electrically connected to the second ohmic electrode 35. The intermediate p-connector 37b may be connected to the second ohmic electrode 35 through an opening 51b formed in the second insulation layer 51. Further, the intermediate p-connector 37b may extend outward of the second LED stack 33, and as shown in FIG. 4B, may partially cover the side surface of the second LED stack 33. The intermediate p-connector 37b may be formed of substantially the same material as the intermediate n-connector 37a, but the inventive concepts are not limited thereto.

The intermediate metal layers 37c and 37d may extend along the side surfaces of the second LED stack 33 from regions on the second LED stack 33. The intermediate metal layers 37c and 37d are spaced apart from the second LED stack 33. The intermediate metal layers 37c and 37d may be insulated from the second LED stack 33 by the second insulation layer 51. The intermediate metal layers 37c and 37d may be formed to protect the second insulation layer 51, or may be omitted. The intermediate metal layers 37c and 37d may be formed of substantially the same material as the intermediate connector 37a, but the inventive concepts are not limited thereto.

The intermediate n-connector 37a, the intermediate p-connector 37b, and the intermediate metal layers 37c and 37d may be disposed at four corners of the second LED stack 33 corresponding to locations where the pillars 73a, 73b, 73c, and 73d are to be formed, respectively. In another exemplary embodiment, the pillars 73, 73b, 73c, 73d may be disposed near each edge of the second LED stack 33, and in this case, the intermediate n-connector 37a, the intermediate p-connector 37b, and intermediate metal layers 37c and 37d may be disposed near the four edges of the second LED stack 33, respectively.

The lower n-connector 47a is electrically connected to the first conductivity type semiconductor layer 43a of the third LED stack 43. The lower n-connector 47a may be connected to the first conductivity type semiconductor layer 43a through an opening 46a of the first insulation layer 46. The lower n-connector 47a may also extend outward of the third LED stack 43 and as shown in FIG. 4A, may partially cover a side surface of the third LED stack 43. Further, the lower n-connector 47a may extend outward of the third LED stack 43 from the side surface thereof, and may be exposed to a bottom surface of the light emitting device 100.

In an exemplary embodiment, the lower n-connector 47a may be in ohmic contact with the first conductivity type semiconductor layer 43a exposed by mesa etching. The lower n-connector 47a may include a Cr layer or an Al layer for ohmic contact, and may be formed of, for example, Cr/Ti/Au/Ti or Al/Ti/Au/Ti. In another exemplary embodiment, an ohmic electrode including the Cr layer or the Al layer may be formed on the first conductivity type semiconductor layer 43a, and the lower n-connector 47a may be connected to the ohmic electrode. In these exemplary embodiments, the lower n-connector 47a may include the Cr layer or the Al layer as a lowermost layer. The Cr layer or Al layer reacts with a laser in a substrate separation process using the laser to facilitate separation of the substrate and the lower n-connector 47a.

The lower p-connector 47b may be electrically connected to the third ohmic electrode 45. The lower p-connector 47b may be connected to the third ohmic electrode 45 through an opening 46b formed in the first insulation layer 46. Further, the lower p-connector 47b may extend outward of the third LED stack 43, and as shown in FIG. 4A, may partially cover the side surface of the third LED stack 43. The lower p-connector 47b may also extend outwardly from the third LED stack 43, and may be exposed to the bottom surface of the light emitting device 100. The lower p-connector 47b may be formed of substantially the same material as the lower n-connector 47a, but the inventive concepts are not limited thereto.

The lower metal layers 47c and 47d may extend along the side surfaces of the third LED stack 43 from regions on the third LED stack 43, respectively. The lower metal layers 47c and 47d may also extend outwardly from the side surface of the third LED stack 43, and may be exposed to the bottom surface of the light emitting device 100. The lower metal layers 47c and 47d are spaced apart from the third LED stack 43. The lower metal layers 47c and 47d may be insulated from the third LED stack 43 by the first insulation layer 46. The lower metal layers 47c and 47d may be formed to protect the first insulation layer 46, or may be omitted. The lower metal layers 47c and 47d may be formed of substantially the same material as the lower connector 47a, but the inventive concepts are not limited thereto.

The lower n-connector 47a, the lower p-connector 47b, and the lower metal layers 47c and 47d may be disposed at four corners of the third LED stack 43 corresponding to locations where the pillars 73a, 73b, 73c, and 73d are to be formed, respectively. In another exemplary embodiment, the pillars 73a, 73b, 73c, 73d may be disposed near each edge of the third LED stack 43, and in this case, the lower n-connector 47a, the lower p-connector 47b, and the lower metal layers 47c and 47d may be disposed near the four edges of the third LED stack 43, respectively.

The first insulation layer 46 may cover a side surface of the mesa to prevent non-radiative recombination occurring at the side surface of the mesa of the third LED stack 43. The side surface of the mesa may include surface defects that may be formed during a mesa etching process, and non-radiative recombination is likely to occur in the surface defects. Moreover, when the light emitting device 100 includes a micro LED having a small light emitting area, light extraction efficiency may be significantly deteriorated by the non-radiative recombination generated at the side surface thereof. As such, chemical treatment may be carried out after the mesa etching process to remove surface defects, and in addition, non-radiative recombination may be prevented by covering the exposed side surface with the first insulation layer 46. Surface treatment on the side surface of the mesa of the third LED stack 43 may be carried out using, for example, a chlorine-based diluted solution such as HCl, FeCl$_3$ or the like, or a basic solution such as KOH, TMAH (tetramethylammonium hydroxide), NaOH, or the like. The first insulation layer 46 may cover the second conductivity type semiconductor layer 43b, the active layer, and the first conductivity type semiconductor layer 43a exposed to the side surface of the mesa. The first insulation layer 46 may be formed using an atomic layer deposition technique, a low pressure chemical deposition technique, or a plasma enhanced chemical deposition technique, and may be formed of, for example, Al$_2$O$_3$, SiN$_x$, or SiO$_2$.

The first insulation layer 46 may cover the third ohmic electrode 45 along with the side surface of the mesa, and further, may cover the upper surface of the first conductivity type semiconductor layer 43a exposed in the mesa etching region. In addition, the first insulation layer 46 may cover the side surface of the first conductivity type semiconductor layer 43a. The first insulation layer 46 may have the opening 46a exposing the first conductivity type semiconductor layer 43a and the opening 46b exposing the third ohmic electrode 45. The lower n-connector 47a, the lower p-connector 47b, and the lower metal layers 47c and 47d may be formed on the first insulation layer 46. The lower n-connector 47a and the lower p-connector 47b may be connected to the first conductivity type semiconductor layer 43a and the third ohmic electrode 45 through the openings 46a and 46b, respectively, and the lower metal layers 47c and 47d may be insulated from the third LED stack 43 by the first insulation layer 46.

The first bonding layer 49 couples the second LED stack 33 to the third LED stack 43. The first bonding layer 49 may be disposed between the first conductivity type semiconductor layer 33a and the third ohmic electrode 45. The first bonding layer 49 may contact the first insulation layer 46, and may partially contact the lower n-connector 47a, the lower p-connector 47b, and the lower metal layers 47c and 47d.

The first bonding layer 49 may be formed of a transparent organic material layer, or may be formed of a transparent inorganic material layer. For example, the organic material layer may include SUB, poly methylmethacrylate (PMMA), polyimide, parylene, benzocyclobutene (BCB), or the like, and the inorganic material layer may include Al$_2$O$_3$, SiO$_2$, SiN$_x$, or the like. In addition, the first bonding layer 49 may be formed of spin-on-glass (SOG).

The second insulation layer 51 may cover a side surface of the mesa to prevent non-radiative recombination occurring at the side surface of the mesa of the second LED stack 33. After the mesa etching process, chemical treatment may be carried out to remove surface defects, and non-radiative recombination may be prevented by covering the exposed side surface with the second insulation layer 51. The surface treatment on the side surface of the mesa of the second LED stack 33 may be carried out using, for example, a chlorine-based diluted solution such as HCl, FeCl$_3$, or the like, or a basic solution such as KOH, TMAH (tetramethylammonium hydroxide), NaOH, or the like. The second insulation layer 51 may cover the second conductivity type semiconductor layer 33b, the active layer, and the first conductivity type semiconductor layer 33a exposed to the side surface of the mesa. The second insulation layer 51 may be formed using an atomic layer deposition technique, a low pressure chemical deposition technique, or a plasma enhanced chemical deposition technique, and may be formed of, for example, Al$_2$O$_3$, SiN$_x$, or SiO$_2$.

The second insulation layer 51 may cover the second ohmic electrode 35 along with the side surface of the mesa, and further, may cover the upper surface of the first conductivity type semiconductor layer 33a exposed in the mesa etching region. Also, the second insulation layer 51 may cover the side surface of the first conductivity type semiconductor layer 33a. The second insulation layer 51 may have the opening 51a exposing the first conductivity type semiconductor layer 33a and the opening 51b exposing the second ohmic electrode 35. The intermediate n-connector 37a, the intermediate p-connector 37b, and the intermediate metal layers 37c and 37d may be formed on the second insulation layer 51. The intermediate n-connector 37a and the intermediate p-connector 37b may be connected to the first conductivity type semiconductor layer 33a and the second ohmic electrode 35 through the openings 51a and 51b, respectively, and the intermediate metal layers 37c and 37d may be insulated from the second LED stack 33 by the second insulation layer 51.

The second bonding layer 59 couples the first LED stack 23 to the second LED stack 33. As shown in the drawing, the second bonding layer 59 may be disposed between the first conductivity type semiconductor layer 23a and the second ohmic electrode 35. Also, the second bonding layer 59 may contact the second insulation layer 51, and may contact the intermediate n-connector 37a, the intermediate p-connector 37b, and the intermediate metal layers 37c and 37d. The second bonding layer 59 may include substantially the same material that may form the first bonding layer 49 described above, and thus, repeated descriptions thereof will be omitted to avoid redundancy.

The third insulation layer 61 may cover a side surface of the mesa to prevent non-radiative recombination occurring at the side surface of the mesa of the first LED stack 23. After the mesa etching process, chemical treatment may be carried out to remove surface defects, and non-radiative recombination may be prevented by covering the exposed side surface with the third insulation layer 61. The surface treatment on the side surface of the mesa of the first LED stack 23 may be carried out using, for example, a diluted HF solution or a diluted HCl solution. The third insulation layer 61 may cover the second conductivity type semiconductor layer 23b, the active layer, and the first conductivity type semiconductor layer 33a exposed to the side surface of the mesa. The third insulation layer 61 may be formed using an atomic layer deposition technique, a low pressure chemical deposition technique, or a plasma enhanced chemical deposition technique, and may be formed of, for example, $Al_2O_3$, $SiN_x$, or $SiO_2$.

The third insulation layer 61 may cover the first ohmic electrode 25 along with the side surface of the mesa, and further, may cover the upper surface of the first conductivity type semiconductor layer 23a and the first ohmic electrode 25 exposed in the mesa etching region. In addition, the third insulation layer 61 may cover the side surface of the first conductivity type semiconductor layer 23a. The third insulation layer 61 may have openings 61a and 61b exposing the n-electrode pad 27a and the first ohmic electrode 25.

The planarization layer 69 may be formed as an insulation layer, and may be planarized using an etching back process or a chemical mechanical polishing process. The planarization layer 69 may be formed to be substantially flat with an upper surface of the third insulation layer 61, but the inventive concepts are not limited thereto. An upper surface of the planarization layer 69 may be placed higher than that of the third insulation layer 61. The planarization layer 69 may be formed of substantially the same material as the first or second bonding layers 49 or 59, but the inventive concepts are not limited thereto.

The upper insulation layer 71 covers the planarization layer 69. The upper insulation layer 71 may be formed of, for example, a silicon oxide film or a silicon nitride film, and is formed of a material having an etching selectivity different from those of the first bonding layer 49, the second bonding layer 59, and the planarization layer 69.

In an exemplary embodiment, the pillars 73a, 73b, 73c, and 73d are disposed near the corners of the light emitting device 100, respectively. At least portions of the pillars 73a, 73b, 73c, and 73d are located outside regions of the first, second, and third LED stacks 23, 33, and 43. The pillars 73a, 73b, 73c, and 73d may have an elongated shape in thickness directions of the first, second, and third LED stacks 23, 33, and 43. For example, the pillars 73a, 73b, 73c, and 73d may have generally a cylindrical shape, without being limited thereto.

The first pillar 73a may be electrically connected to the first conductivity type semiconductor layers 23a, 33a, and 43a, the second pillar 73b may be electrically connected to the second conductivity type semiconductor layer 23b of the first LED stack 23, the third pillar 73c may be electrically connected to the second conductivity type semiconductor layer 33b of the second LED stack 33, and the fourth pillar 73d may be electrically connected to the second conductivity type semiconductor layer 43b of the third LED stack 43.

For example, the first pillar 73a may be connected to the lower n-connector 47a and the intermediate n-connector 37a to be electrically connected to the first conductivity type semiconductor layers 43a and 43b through the lower n-connector 47a and the intermediate n-connector 37a, respectively. The third pillar 73c may be connected to the intermediate p-connector 37b to be electrically connected to the second ohmic electrode 35. The fourth pillar 73d may be connected to the lower p-connector 47b to be electrically connected to the third ohmic electrode 45.

The pads 75a, 75b, 75c, and 75d may be electrically connected to the first to fourth pillars 73a, 73b, 73c, and 73d, respectively, and may extend to an upper region of the first LED stack 23 from the pillars. The pad 75a may electrically connect the first pillar 73a and the n-electrode pad 27a. As shown in FIG. 4A, the pad 75a may pass through the upper insulation layer 71 and the planarization layer 69, and may be connected to the n-electrode pad 27a through the opening 61a of the third insulation layer 61.

In addition, the pad 75b may electrically connect the second pillar 73b to the first ohmic electrode 25. The pad 75b may pass through the upper insulation layer 71 and may be connected to the first ohmic electrode 25 through the opening 61b of the third insulation layer 61.

As such, the first LED stack 23 may be electrically connected to the first pad 75a and the second pad 75b, the second LED stack 33 may be electrically connected to the first pad 75a and the third pad 75c, and the third LED stack 43 may be electrically connected to the first pad 75a and the fourth pad 75d. Since the LED stacks 23, 33, and 43 are electrically connected to two different pads, the LED stacks 23, 33, and 43 may be independently driven.

Accordingly, each of the second, third, and fourth pads 75b, 75c, and 75d may be electrically connected to the second conductivity type semiconductor layers 23b, 33b, and 43b of the first, second, and third LED stacks 23, 33, and 43, and the first pad 75a may be commonly electrically connected to the first conductivity type semiconductor layers 23a, 33a, and 43a of the first, second, and third LED stacks 23, 33, and 43.

The pads 75a, 75b, 75c, and 75d may include a highly reflective metal layer, a barrier metal layer, and an adhesive layer. For example, the pads 75a, 75b, 75c, and 75d may be formed of Ti/Au/Ni/Au, or may be formed of Ti/Al/Ni/Au, or Ti/Ag/Ni/Au. However, the inventive concepts are not limited to these metal layers, and the pads 75a, 75b, 75c, and 75d may include In or AuSn in other exemplary embodiments.

According to the illustrated exemplary embodiment, the first LED stack 23 is electrically connected to the pads 75a and 75b, the second LED stack 33 is electrically connected to the pads 75a and 75c, and the third LED stack 43 is electrically connected to the pads 75a and 75d. Accordingly, cathodes of the first LED stack 23, the second LED stack 33, and the third LED stack 43 are commonly electrically connected to the first pad 75a, and anodes thereof are electrically connected to the second, third, and fourth pads 75b, 75c, and 75d, respectively. Accordingly, the first, second, and third LED stacks 23, 33, and 43 may be driven independently.

According to the illustrated exemplary embodiment, the first to third LED stacks 23, 33, 43 and the pads 75a, 75b, 75c, and 75d may be electrically connected using the first, second, third, and fourth pillars 73a, 73b, 73c, and 73d. Moreover, the first, second, third, and fourth pillars 73a, 73b, 73c, and 73d are disposed outside the first, second, and third LED stacks 23, 33, and 43, unlike conventional through vias. In this manner, it is possible to alleviate reduction in the light emitting area of the LED stacks by employing the first, second, third, and fourth pillars 73a, 73b, 73c, and 73d, and thus, the light emitting device 100 according to an exemplary embodiment may be suitably used for micro LEDs having a size of 10 µm×10 µm or less, further, 5 µm×5 µm or less, and furthermore, 3 µm×3 µm or less.

Figure 5A:
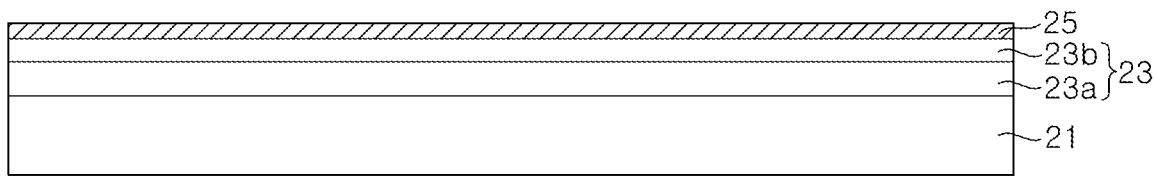
FIGS. 5A, 5B, and 5C are schematic cross-sectional views of first, second, and third LED stacks grown on growth substrates, respectively, according to an exemplary embodiment.
Figure 5B:
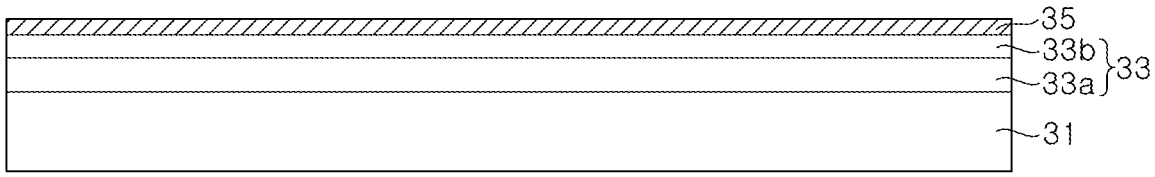
Figure 5C:
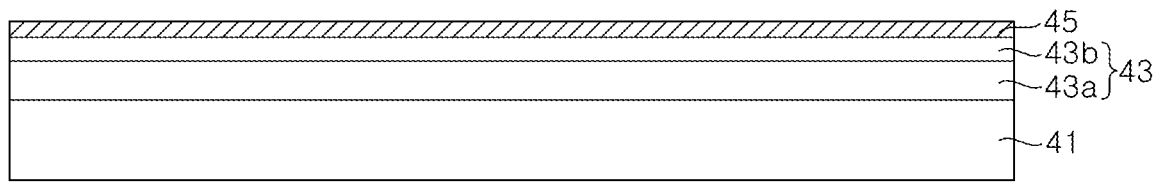

Hereinafter, a method of manufacturing the light emitting device 100 will be described in detail. A structure of the light emitting device 100 will also be understood in more detail through the manufacturing method described below. FIGS. 5A, 5B, and 5C are schematic cross-sectional views illustrating the first, second, and third LED stacks grown on growth substrates, respectively, according to an exemplary embodiment.

Referring to FIG. 5A, a first LED stack 23 including a first conductivity type semiconductor layer 23a and a second conductivity type semiconductor layer 23b is grown on a first substrate 21. An active layer may be interposed between the first conductivity type semiconductor layer 23a and the second conductivity type semiconductor layer 23b.

The first substrate 21 may be a substrate capable of growing the first LED stack 23 thereon, such as a GaAs substrate. The first conductivity type semiconductor layer 23a and the second conductivity type semiconductor layer 23b may be formed of an AlGaInAs-based or AlGaInP-based semiconductor layer, and the active layer may include, for example, an AlGaInP-based well layer. A composition ratio of AlGaInP may be determined so that the first LED stack 23 emits red light, for example.

A first ohmic electrode 25 may be formed on the second conductivity type semiconductor layer 23b. The first ohmic electrode 25 may be formed of a metal layer or a conductive oxide layer that transmits light generated by the first LED stack 23, for example, red light, or may be formed of a metal layer that reflects red light. The first ohmic electrode 25 may be formed of, for example, indium-tin oxide (ITO).

Referring to FIG. 5B, a second LED stack 33 including a first conductivity type semiconductor layer 33a and a second conductivity type semiconductor layer 33b is grown on a second substrate 31. An active layer may be interposed between the first conductivity type semiconductor layer 33a and the second conductivity type semiconductor layer 33b.

The second substrate 31 may be a substrate capable of growing the second LED stack 33 thereon, such as a sapphire substrate, a SiC substrate, or a GaN substrate. In an exemplary embodiment, the second substrate 31 may be a flat sapphire substrate, but may be a patterned sapphire substrate. The first conductivity type semiconductor layer 33a and the second conductivity type semiconductor layer 33b may be formed of an AlGaInN-based semiconductor layer, and the active layer may include, for example, an AlGaInN-based well layer. A composition ratio of AlGaInN may be determined so that the second LED stack 33 emits blue light, for example.

A second ohmic electrode 35 may be formed on the second conductivity type semiconductor layer 33b. As described above, the second ohmic electrode 35 may be formed of a metal layer or a conductive oxide layer that transmits light generated by the first LED stack 23, for example, red light. In particular, the second ohmic electrode 35 may be formed of ZnO.

Referring to FIG. 5C, a third LED stack 43 including a first conductivity type semiconductor layer 43a and a second conductivity type semiconductor layer 43b is grown on a third substrate 41. An active layer may be interposed between the first conductivity type semiconductor layer 43a and the second conductivity type semiconductor layer 43b.

The third substrate 41 may be a substrate capable of growing the third LED stack 43 thereon, such as a sapphire substrate, a GaN substrate, or a GaAs substrate. The first conductivity type semiconductor layer 43a and the second conductivity type semiconductor layer 43b may be formed of an AlGaInAs-based or AlGaInP-based semiconductor layer, or an AlGaInN-based semiconductor layer, and the active layer may include, for example, an AlGaInP-based well layer or AlGaInN-based well layer. A composition ratio of AlGaInP or AlGaInN may be determined so that the third LED stack 43 emits green light, for example.

A third ohmic electrode 45 may be formed on the second conductivity type semiconductor layer 43b. As described above, the third ohmic electrode 45 may be formed of a metal layer or a conductive oxide layer that transmits light generated in the first and second LED stacks 23 and 33, for example, red light and blue light. For example, the third ohmic electrode 45 may be formed of ZnO.

The first, second, and third LED stacks 23, 33, and 43 are grown on the different growth substrates 21, 31, and 41, respectively, and, accordingly, the order of manufacturing the first, second, and third LED stacks 23, 33, and 43 is not particularly limited.

Hereinafter, a method of manufacturing the light emitting device 100 using first, second, and third LED stacks 23, 33, and 43 grown on growth substrates 21, 31, and 41 will be described. Hereinafter, although a region of a single light emitting device 100 will be mainly illustrated and described, a plurality of light emitting devices 100 may be manufactured in a batch in the same manufacturing process using the LED stacks 23, 33, and 43 grown on the growth substrates 21, 31, and 41.

FIGS. 6A, 6B, 6C, 7A, 7B, 7C, 8A, 8B, 8C, 9A, 9B, 9C, 10A, 10B, 10C, 11A, 11B, 11C, 12A, 12B, 12C, 13A, 13B, 13C, 14A, 14B, 14C, 15A, 15B, 15C, 16A, 16B, 16C, 17A, 17B, and 17C are schematic plan views and cross-sectional views illustrating a method of manufacturing a light emitting device 100 according to an exemplary embodiment. The cross-sectional views correspond to the cross-sectional views taken along lines A-A' or B-B' of FIG. 3.

Figure 6A:
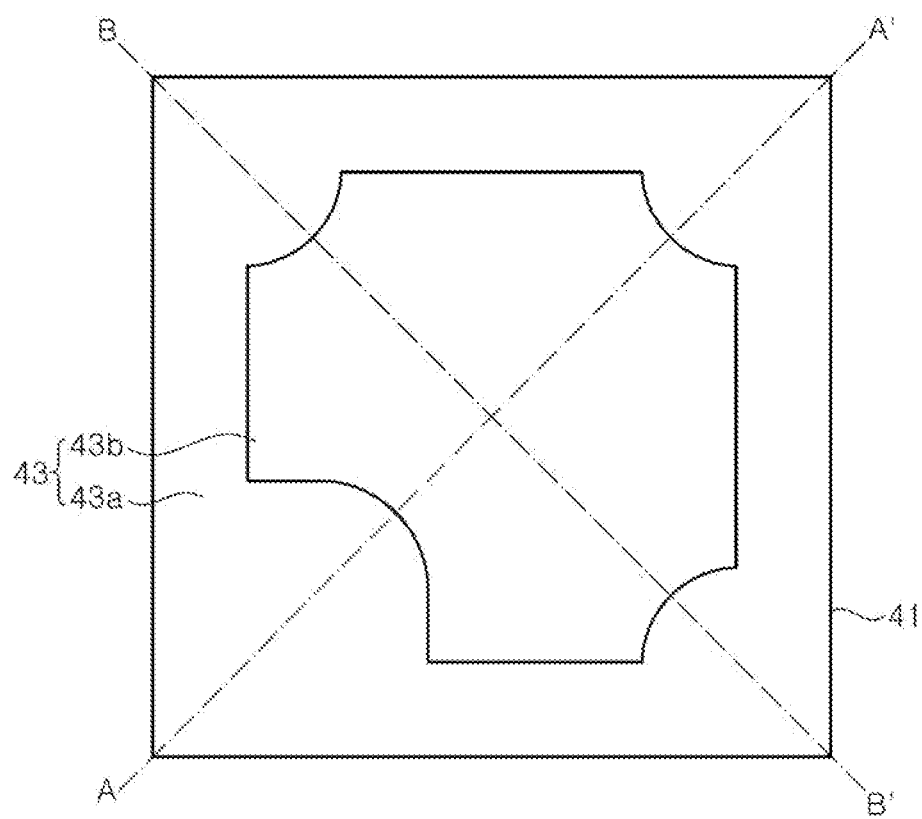
FIGS. 6A, 6B, 6C, 7A, 7B, 7C, 8A, 8B, 8C, 9A, 9B, 9C, 10A, 10B, 10C, 11A, 11B, 11C, 12A, 12B, 12C, 13A, 13B, 13C, 14A, 14B, 14C, 15A, 15B, 15C, 16A, 16B, 16C, 17A, 17B, and 17C are schematic plan views and cross-sectional views illustrating a method of manufacturing a light emitting device for a display according to an exemplary embodiment.
Figure 6B:
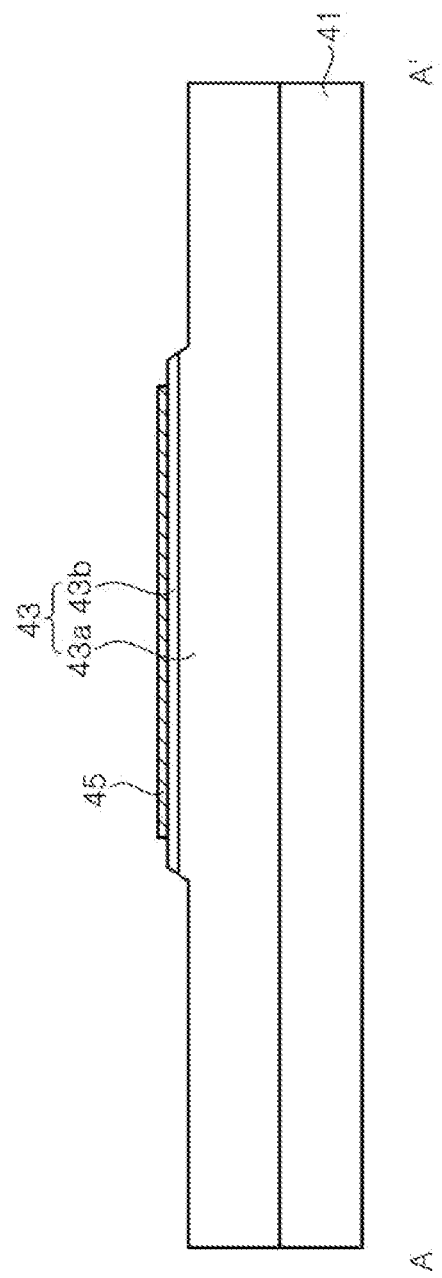
Figure 6C:
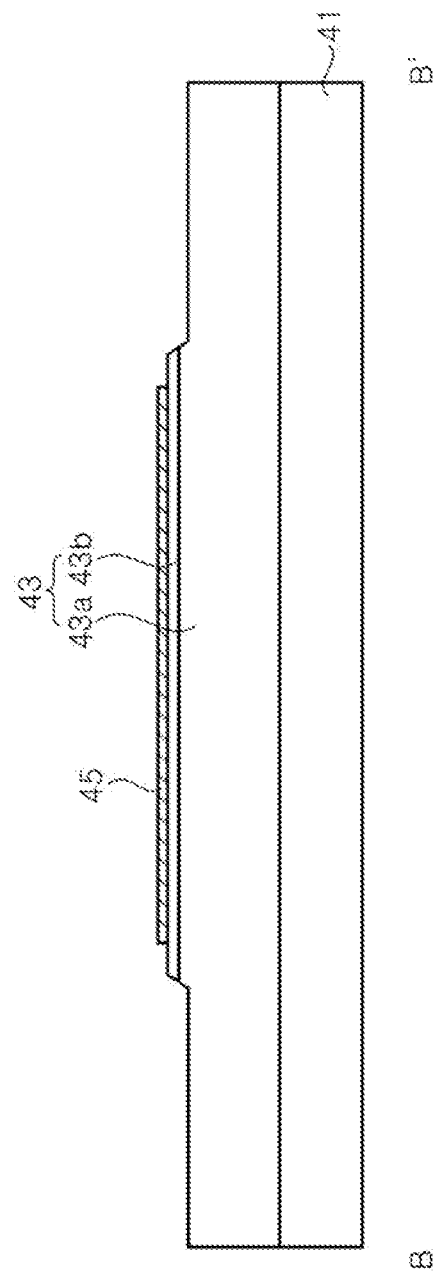

Referring to FIGS. 6A, 6B, and 6C, the third ohmic electrode 45 and the second conductivity type semiconductor layer 43b of the third LED stack 43 are patterned to expose the first conductivity type semiconductor layer 43a using photolithography and etching techniques. This process corresponds to, for example, a mesa etching process. A photoresist pattern may be used as an etching mask. For example, after the etching mask is formed, the third ohmic electrode 45 may be etched first by a wet etching technique, and thereafter, the second conductivity type semiconductor layer 43b may be etched by a dry etching technique using the same etching mask. In this manner, the third ohmic electrode 45 may be recessed from a mesa etching region. FIG. 6A exemplarily shows an edge of the mesa and does not show an edge of the third ohmic electrode 45 to simplify illustration. However, since the third ohmic electrode 45 is wet etched using the same etching mask, the edge of the third ohmic electrode 45 may also be recessed inwardly from the edge of the mesa. Since the same etching mask is used to etch the ohmic electrode 45 and the second conductivity type semiconductor layer 43b, the number of photolithography processes may not be increased, thereby reducing the manufacturing costs. However, the inventive concepts are not limited thereto, and the etching mask for the mesa etching process may be different from the etching mask for etching the third ohmic electrode 45.

In the illustrated exemplary embodiment, the mesa may include a partial thickness of the first conductivity type semiconductor layer 43a, an active layer, and the second conductivity type semiconductor layer 43b. The mesa may be located inside of a region surrounded by an edge of the first conductivity type semiconductor layer 43, and thus, an upper surface of the first conductivity type semiconductor layer 43a is exposed along a periphery of the mesa.

As shown in FIG. 6A, a mesa may have substantially a quadrangular shape from which corner regions thereof are removed. In addition, one of the four corner regions of the mesa may be removed to the greater extent than the remaining regions.

Thereafter, chemical treatment may be carried out to remove surface defects formed during the mesa etching process. For example, surface treatment may be carried out using a chlorine-based diluted solution such as HCl, $FeCl_3$ or the like, or a basic solution such as KOH, tetramethylammonium hydroxide (TMAH), or NaOH. Surface treatment may reduce non-radiative recombination by removing surface defects on a side surface of the mesa.

Figure 7A:
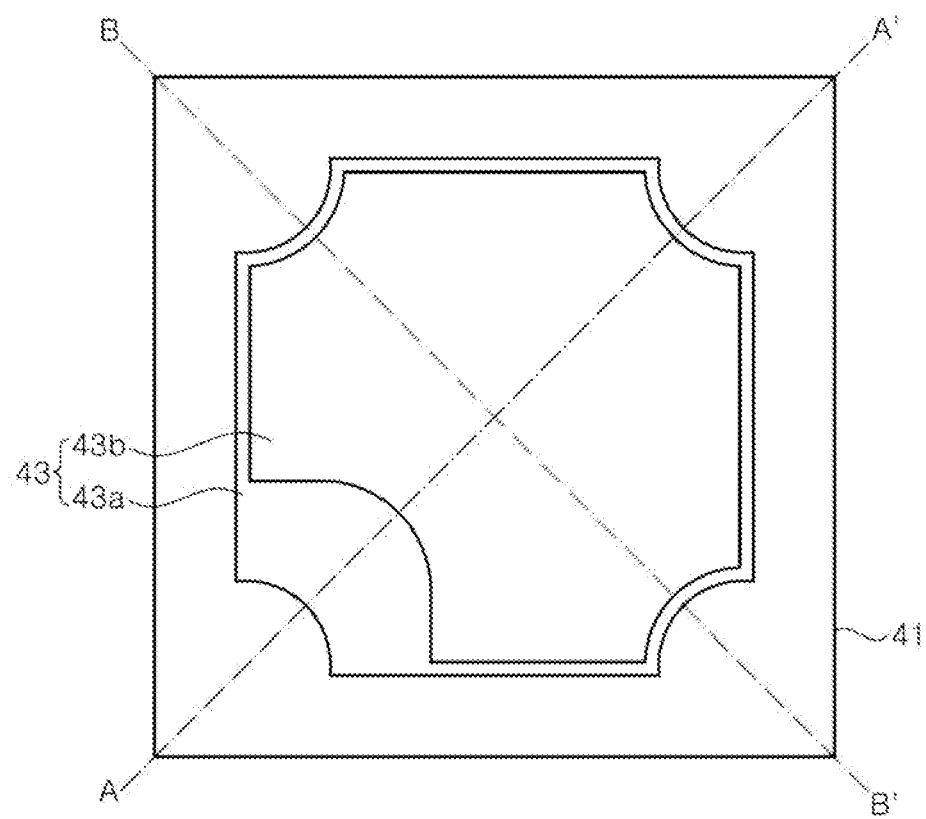
Figure 7B:
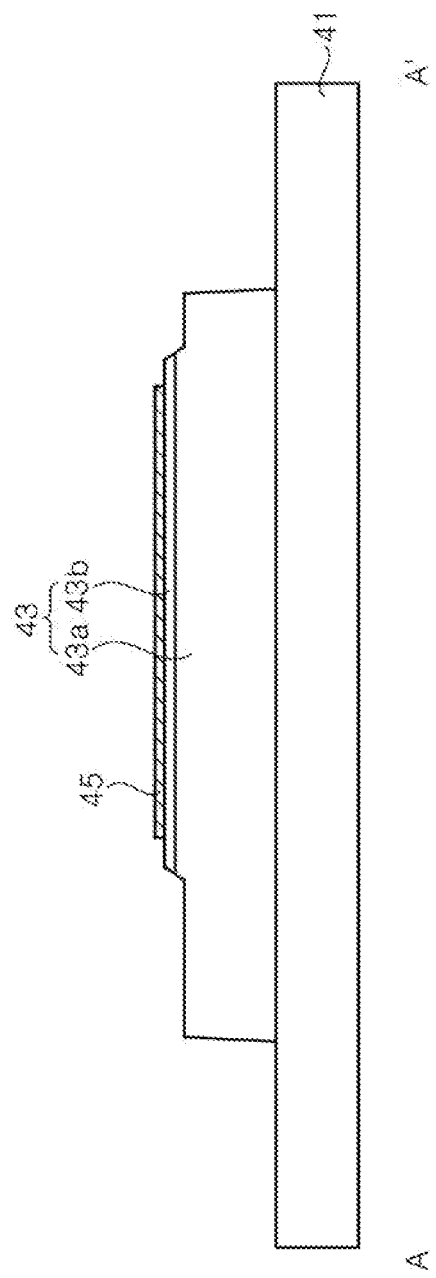
Figure 7C:
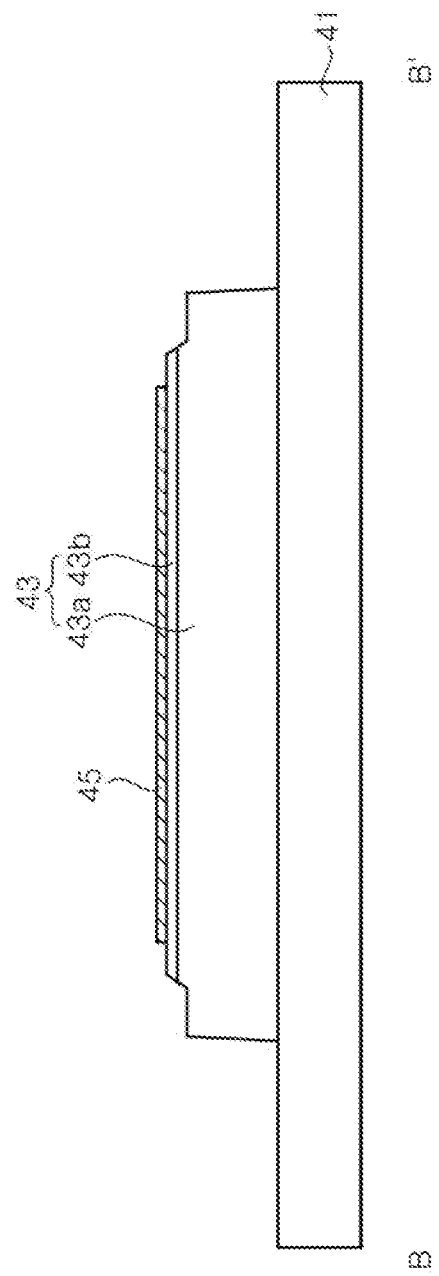

Referring to FIGS. 7A, 7B, and 7C, an isolation region for defining a light emitting device region may be formed. For example, the first conductivity type semiconductor layer 43a may be removed along the isolation region and an upper surface of the substrate 41 may be exposed.

A plurality of light emitting device regions is formed on the substrate 41, and the isolation region separates the light emitting device regions from one another. As shown in FIG. 7A, the first conductivity type semiconductor layer 43a may be etched so that a portion of the upper surface of the first conductivity type semiconductor layer 43a is exposed around the mesa.

In an exemplary embodiment, surface treatment may be carried out to remove surface defects formed during the mesa etching process and the device isolation process. The surface treatment of the third LED stack 43 may be carried out using, for example, a chlorine-based diluted solution such as HCl, $FeCl_3$, or the like, or a basic solution such as KOH, TMAH (tetramethylammonium hydroxide), NaOH, or the like. The surface treatment may be carried out after the mesa etching process, and before the device isolation process.

Figure 8A:
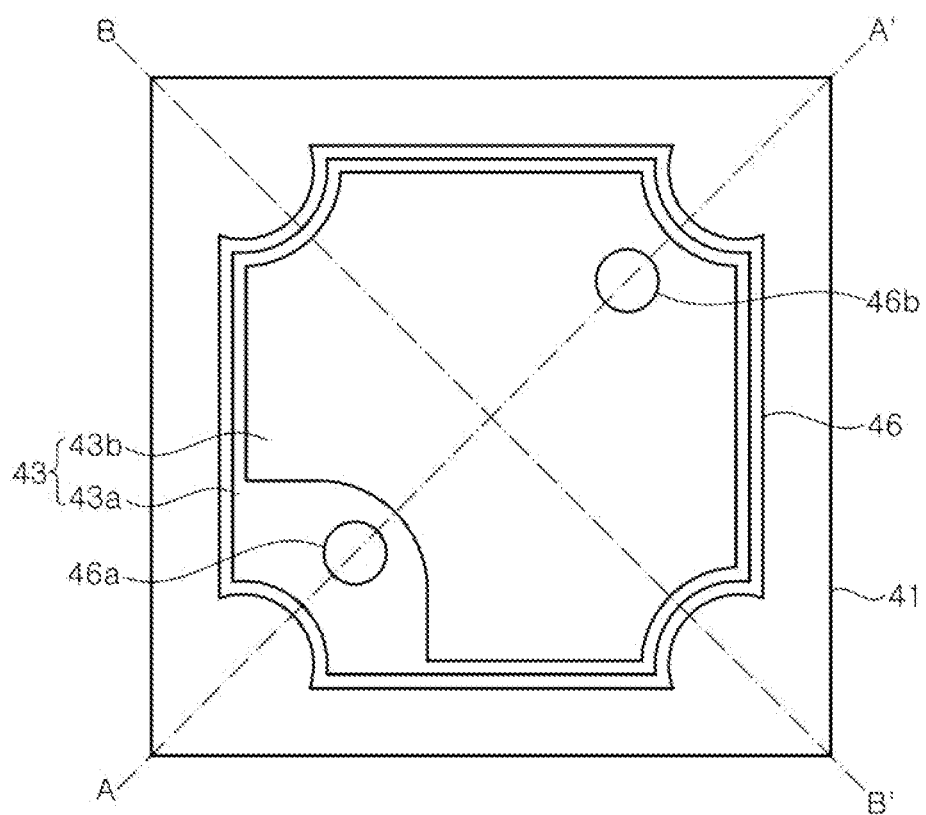
Figure 8B:
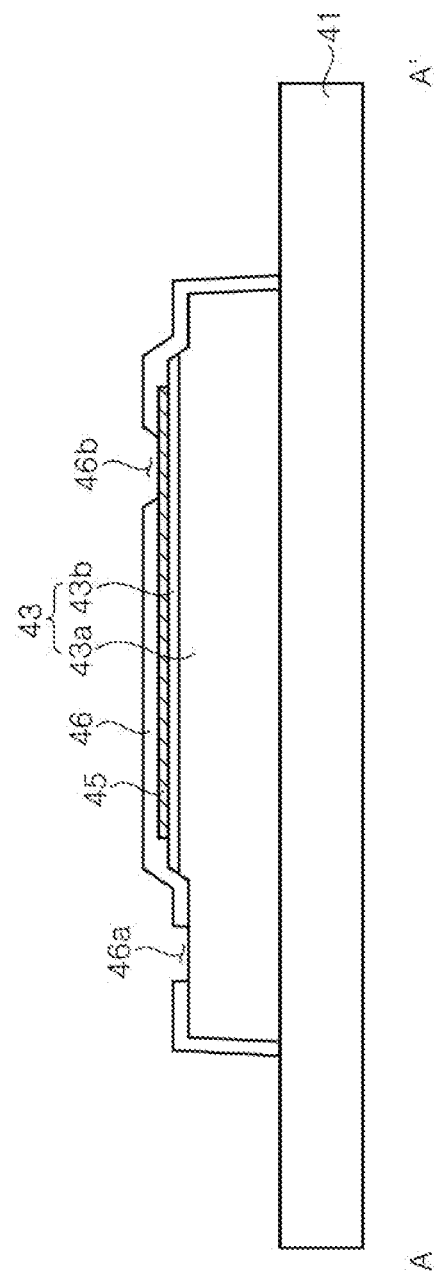
Figure 8C:
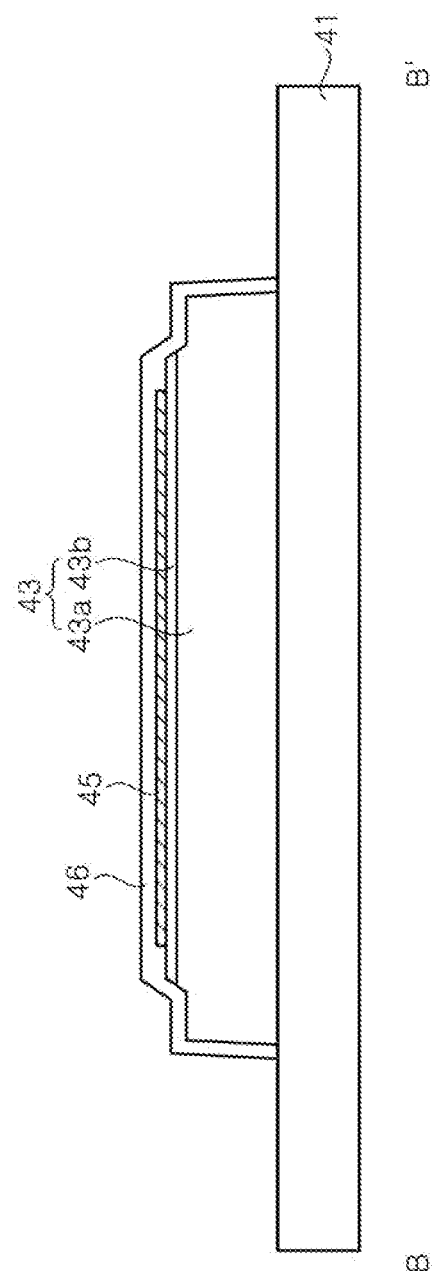

Referring to FIGS. 8A, 8B, and 8C, a first insulation layer 46 covering the third LED stack 43 and the third ohmic electrode 45 is formed. The first insulation layer 46 may be formed to prevent non-radiative surface recombination. In particular, the first insulation layer 46 may cover the side surface of the mesa to prevent non-radiative recombination that may otherwise occur at the side surface of the mesa. The first insulation layer 46 may be formed using an atomic layer deposition technique, a low pressure chemical vapor deposition technique, or a damage free plasma enhanced chemical vapor deposition technique, and may be formed of, for example, $Al_2O_3$, $SiN_x$, $SiO_2$, or the like.

The first insulation layer 46 may be patterned to have openings 46a and 46b exposing the first conductivity type semiconductor layer 43a and the third ohmic electrode 45. The openings 46a and 46b may be formed near two different corners among the four corners of the mesa. As shown in FIG. 8A, the openings 46a and 46b may be disposed in the diagonal direction, but the inventive concepts are not limited thereto.

The first insulation layer 46 may also cover a side surface of the third LED stack 43, but may expose the upper surface of the substrate 41 around the third LED stack 43.

Figure 9A:
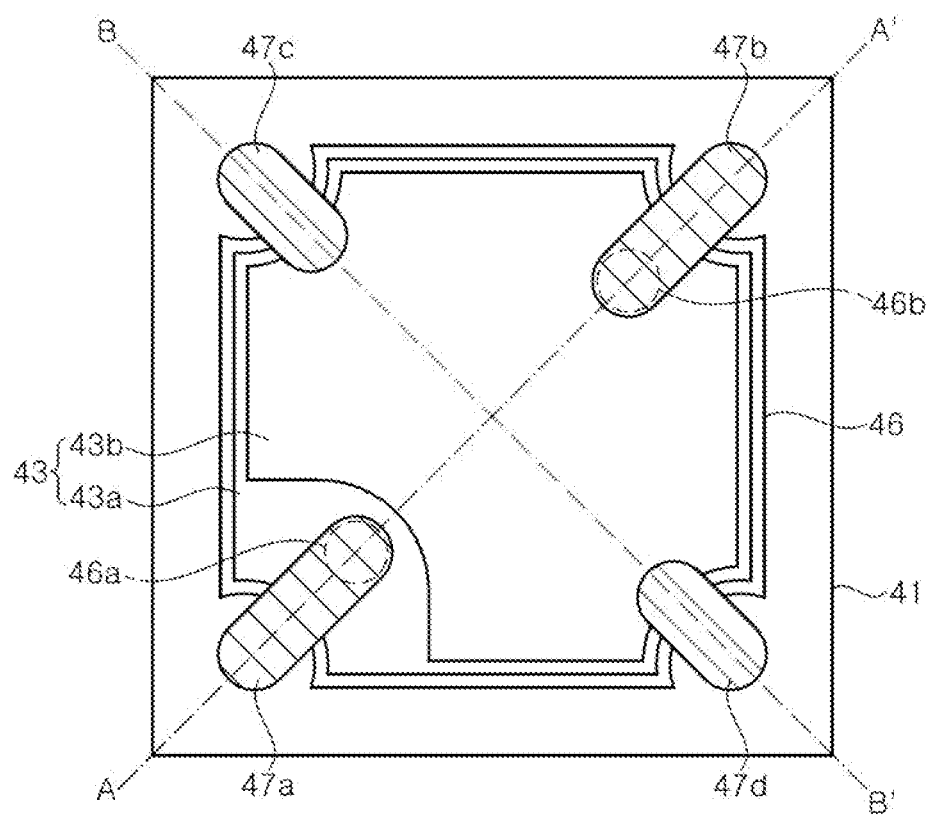
Figure 9B:
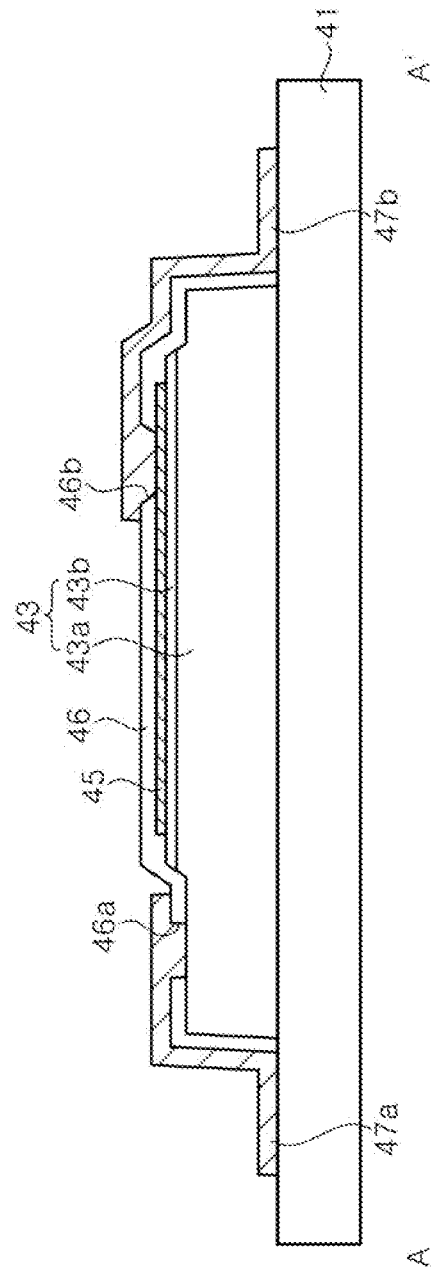
Figure 9C:
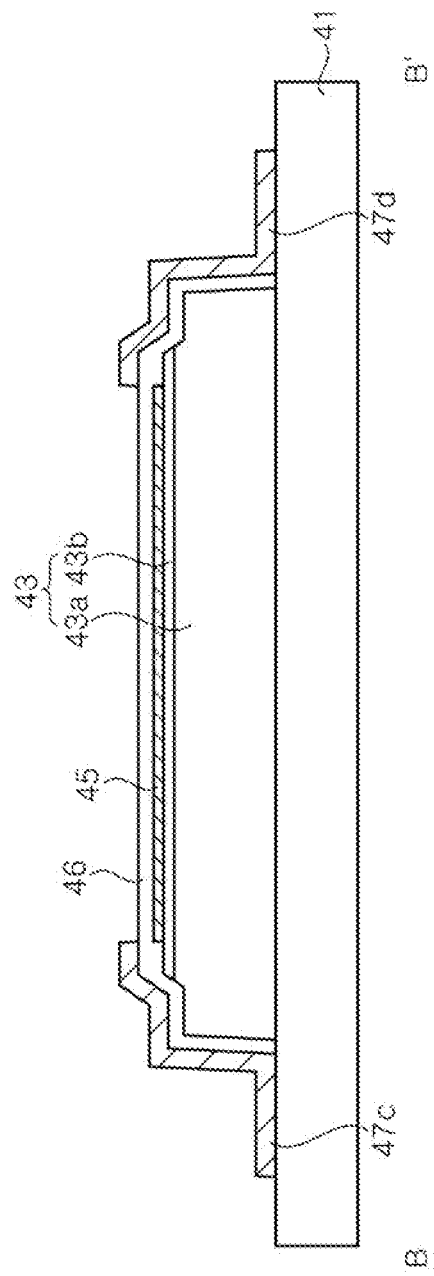

Referring to FIGS. 9A, 9B, and 9C, a lower n-connector 47a, a lower p-connector 47b, and lower metal layers 47c and 47d are formed on the third LED stack 43. The lower n-s connector 47a may be electrically connected to the first conductivity type semiconductor layer 43 through the opening 46a, and the lower p-connector 47b may be electrically connected to the third ohmic electrode 45 through the opening 46b. The lower metal layers 47c and 47d may be disposed on the first insulation layer 46 while being insulated from the third LED stack 43.

At least portions of the lower n-connector 47a, the lower p-connector 47b, and the lower metal layers 47c and 47d may be formed on the substrate 41. As shown in the drawing, the lower n-connector 47a, the lower p-connector 47b, and the lower metal layers 47c and 47d may extend outwardly along the upper surface of the substrate 41 from the side surface of the third LED stack 43. The lower n-connector 47a, the lower p-connector 47b, and the lower metal layers 47c and 47d may include a Cr layer or an Al layer as the lowermost layer.

Figure 10A:
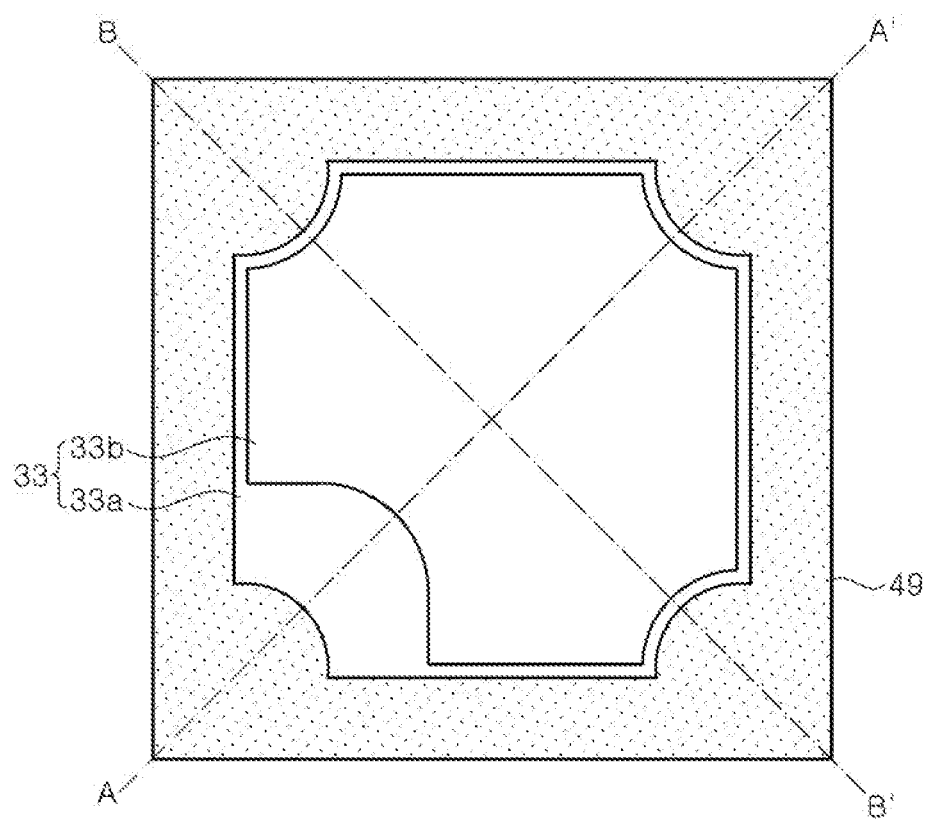
Figure 10B:
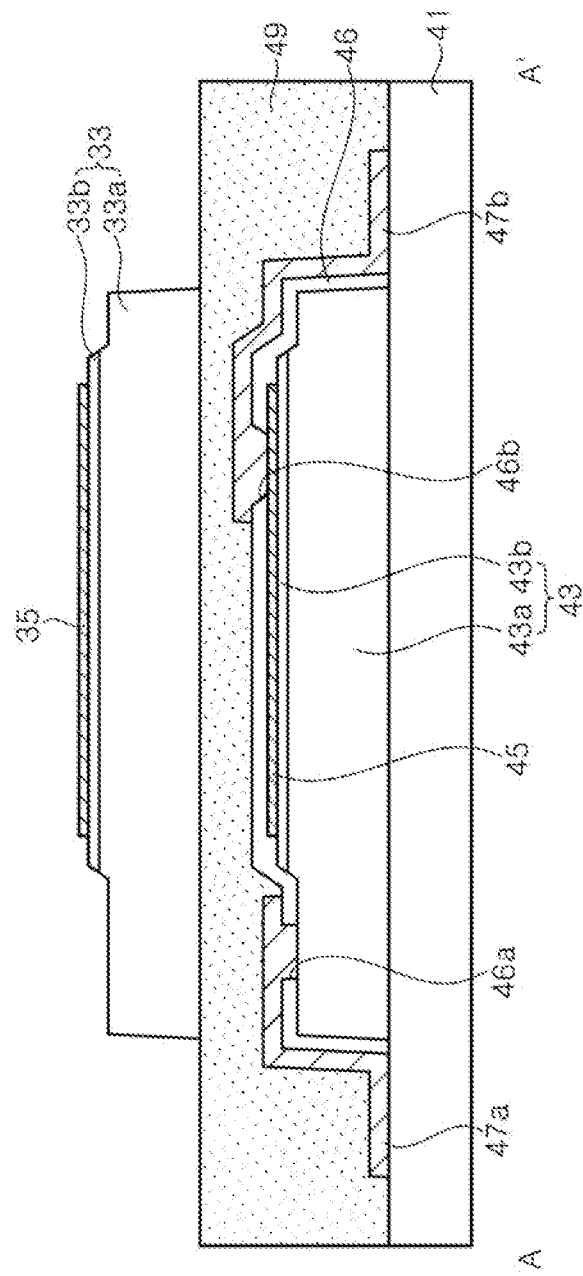
Figure 10C:
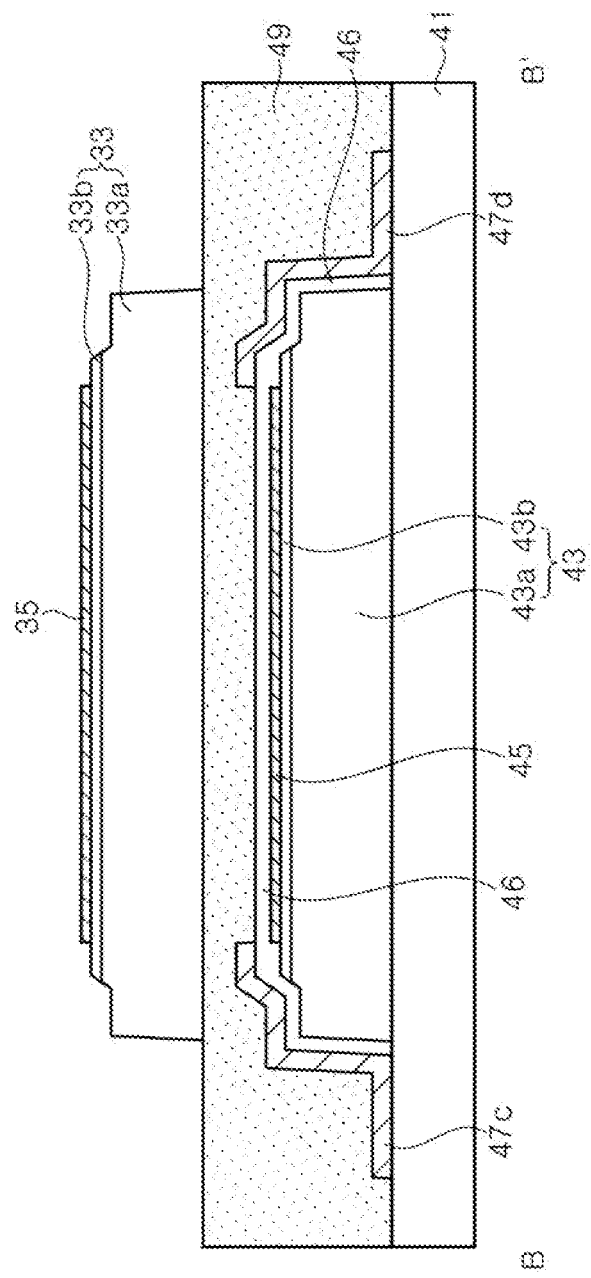

Referring to FIGS. 10A, 10B, and 10C, the second LED stack described with reference to FIG. 5B is bonded onto the third LED stack 43. The second LED stack 33 is bonded to a temporary substrate using a temporary bonding/debonding (TBDB) technique, and the second substrate 31 is removed from the second LED stack 33. The second substrate 31 may be removed using, for example, a laser lift off technique. After the second substrate 31 is removed, a roughened surface may be formed on a surface of the first conductivity type semiconductor layer 33a. Thereafter, the first conductivity type semiconductor layer 33a of the second LED stack 33 bonded to the temporary substrate may be disposed to face the third LED stack 43 and bonded to the third LED stack 43. The second LED stack 33 and the third LED stack 43 are bonded to each other by a first bonding layer 49. After bonding the second LED stack 33 to the third LED stack 43, the temporary substrate may be removed using the laser lift off technique. Accordingly, the second LED stack 33 may be disposed on the third LED stack 43, in which the second ohmic electrode 35 may form an upper surface.

Subsequently, as described above, a mesa etching process and a device isolation process are carried out, so that the first conductivity type semiconductor layer 33a may be defined in the light emitting device region, and a mesa located on the first conductivity type semiconductor layer 33a may be formed. Also, the second ohmic electrode 35 may be recessed than the second conductivity type semiconductor layer 33b. Meanwhile, the first bonding layer 49 may be exposed around the second LED stack 33.

Furthermore, surface treatment may be carried out to remove surface defects. For example, as described above, surface defects formed on the surface of the second LED stack 33 may be removed by chemical treatment using a chlorine-based solution or a basic solution, thereby reducing non-radiative surface recombination. The surface treatment may be carried out before or after the device isolation process.

Figure 11A:
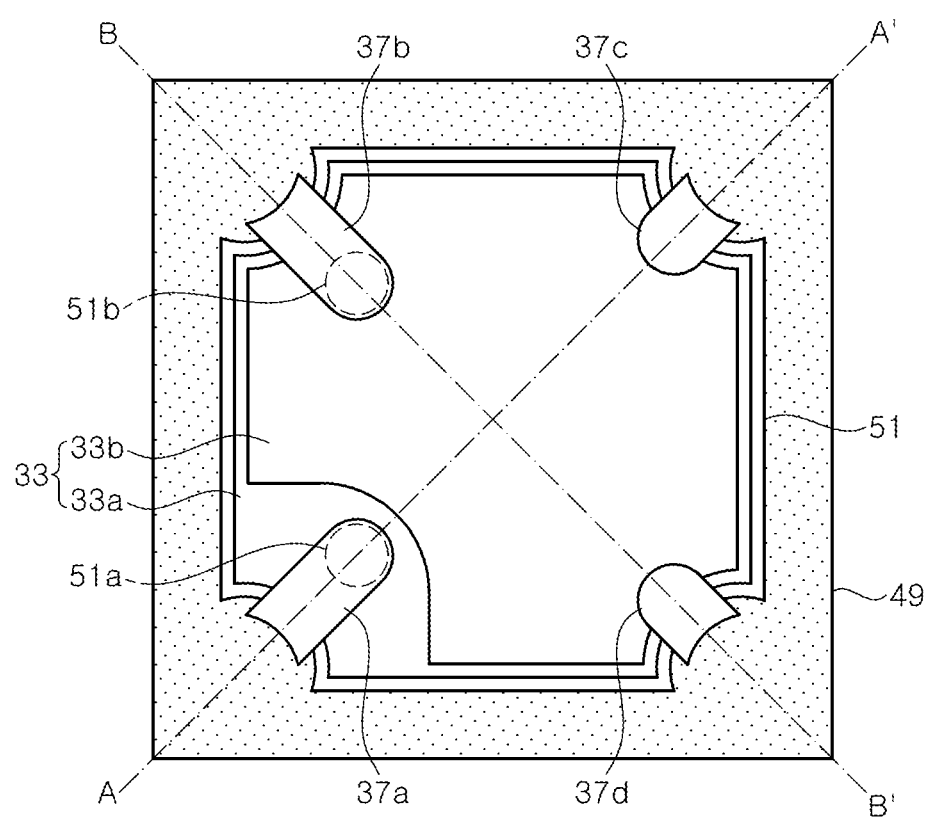
Figure 11B:
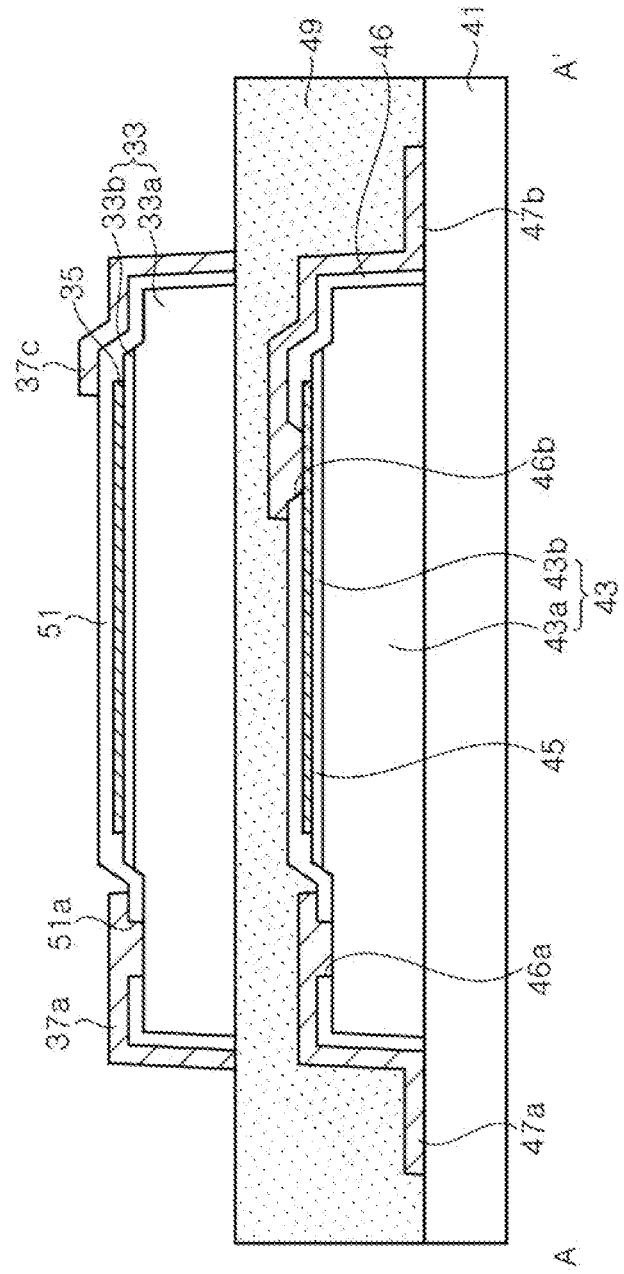
Figure 11C:
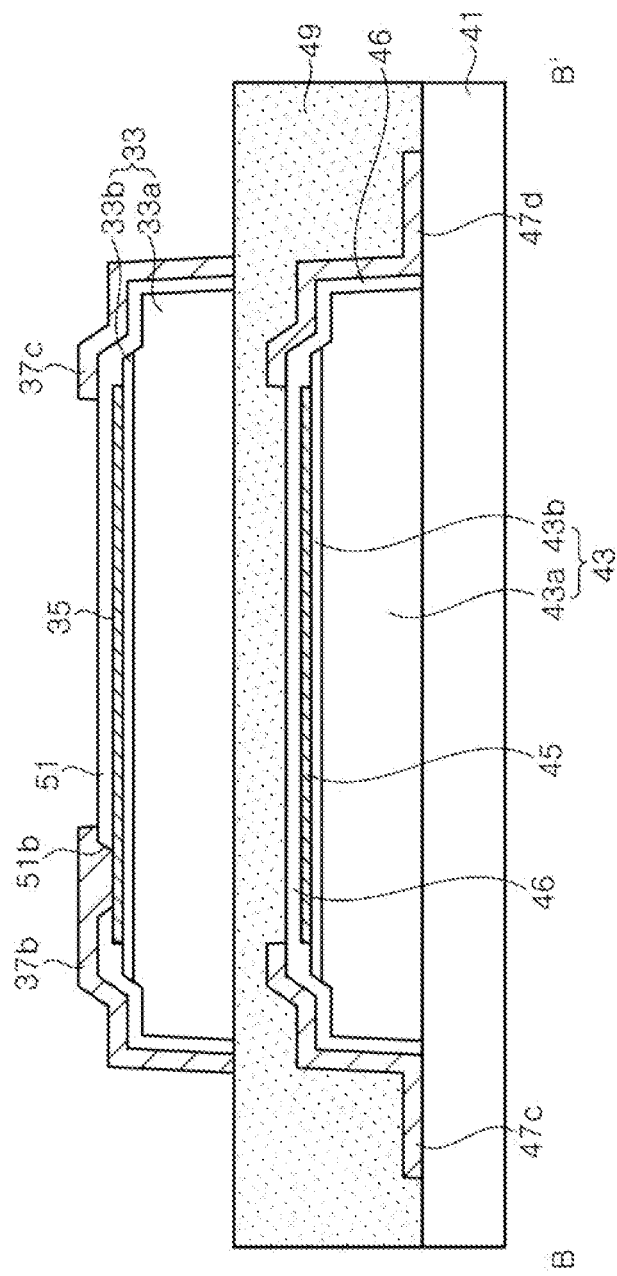

Referring to FIGS. 11A, 11B and 11C, a second insulation layer 51 covering the second LED stack 33 and the second ohmic electrode 35 is formed. The second insulation layer 51 may be formed to prevent non-radiative surface recombination. In particular, the second insulation layer 51 may cover the side surface of the mesa to prevent non-radiative recombination that may otherwise occur at the side surface of the mesa. The second insulation layer 51 may be formed using an atomic layer deposition technique, a low pressure chemical vapor deposition technique, or a damage free plasma enhanced chemical vapor deposition technique, and may be formed of, for example, $Al_2O_3$, $SiN_x$, $SiO_2$, or the like.

The second insulation layer 51 may be patterned to have openings 51a and 51b exposing the first conductivity type semiconductor layer 33a and the second ohmic electrode 35. The openings 51a and 51b may be formed near two different corners among the four corners of the mesa. In addition, the opening 51b is disposed to be spaced apart from the opening 46b of the first insulation layer 46 described above.

The second insulation layer 51 may also cover the side surface of the second LED stack 33, while exposing an upper surface of the first bonding layer 49 around the second LED stack 33.

An intermediate n-connector 37a, an intermediate p-connector 37b, and intermediate metal layers 37c and 37d are formed on the second LED stack 33. The intermediate n-connector 37a may be electrically connected to the first conductivity type semiconductor layer 33a through the opening 51a, and the intermediate p-connector 37b may be electrically connected to the second ohmic electrode 35 through the opening 51b. The lower metal layers 37c and 37d may be disposed on the second insulation layer 51 while being insulated from the second LED stack 33.

The intermediate n-connector 37a, the intermediate p-connector 37b, and the intermediate metal layers 37c and 37d may be formed near four corners of the second LED stack 33, and may cover the second insulation layer 51 on the side surface of the second LED stack 33.

The intermediate n-connector 37a may include a Cr layer or an Al layer for ohmic contact, and may further include Ti/Au/Ti. The intermediate p-connector 37b and the intermediate metal layers 37c and 37d may be formed of substantially the same material as the intermediate n-connector 37a, but the inventive concepts are not limited thereto.

Figure 12A:
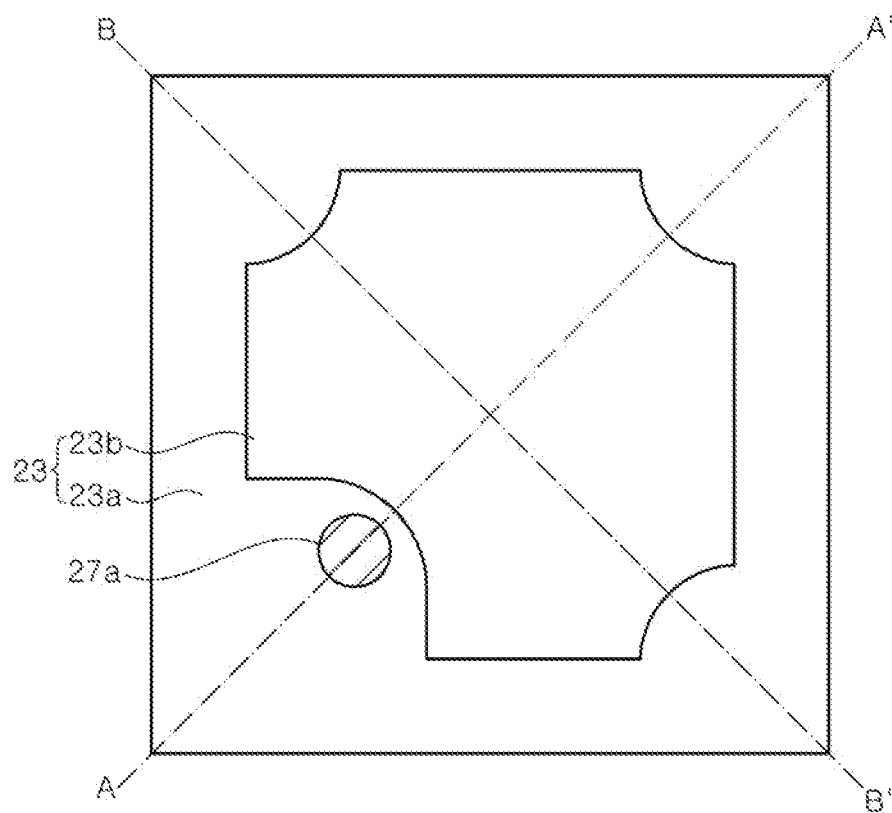
Figure 12B:
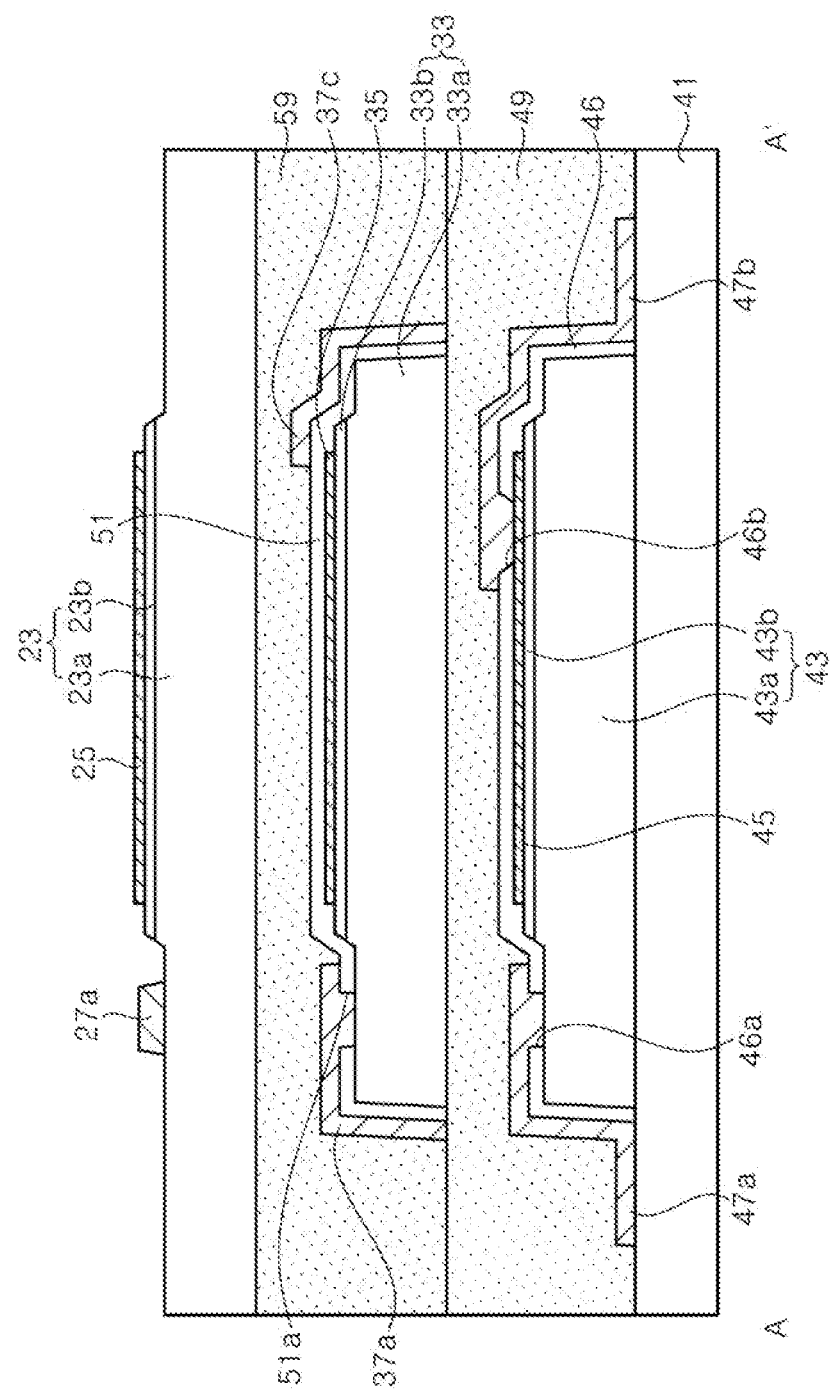
Figure 12C:
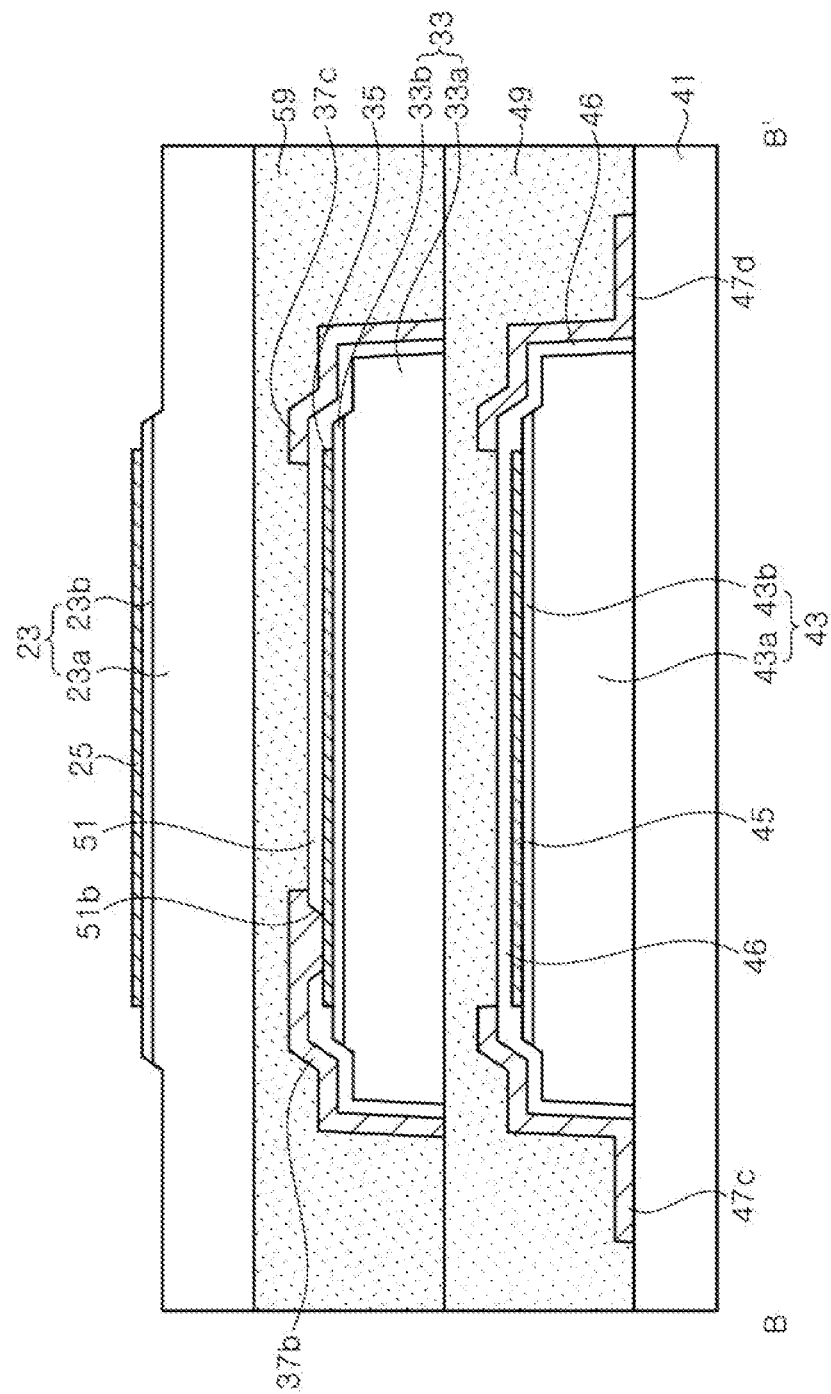

Referring to FIGS. 12A, 12B, and 12C, the first LED stack 23 described in FIG. 5A is bonded to the second LED stack 33. The first LED stack 23 may be bonded onto the second LED stack 33 using TBDB technology described above. Meanwhile, in the TBDB process, the first substrate 21 is removed from the first LED stack 23. The first substrate 21 may be removed using, for example, an etching technique.

The first LED stack 23 and the second LED stack 33 may be bonded using the second bonding layer 59 so that the first conductivity type semiconductor layer 23a faces the second LED stack 33. Accordingly, the second bonding layer 59 may contact the first conductivity type semiconductor layer 23a, and may also contact the intermediate n-connector 37a, the intermediate p-connector 37b, the intermediate metal layers 37c and 37d, and the second insulation layer 51. In addition, the second bonding layer 59 may contact the first bonding layer 49 exposed around the second LED stack 33.

Thereafter, the first ohmic electrode 25 and the second conductivity type semiconductor layer 23b are patterned to form a mesa. The mesa may be formed to have a shape similar to that of the second LED stack 33 or the third LED stack 43. Meanwhile, an n-electrode pad 27a may be formed on the first conductivity type semiconductor layer 23a exposed around the mesa. In an exemplary embodiment, the n-electrode pad 27a may be disposed over the lower n-connector 47a and the intermediate n-connector 37a.

Figure 13A:
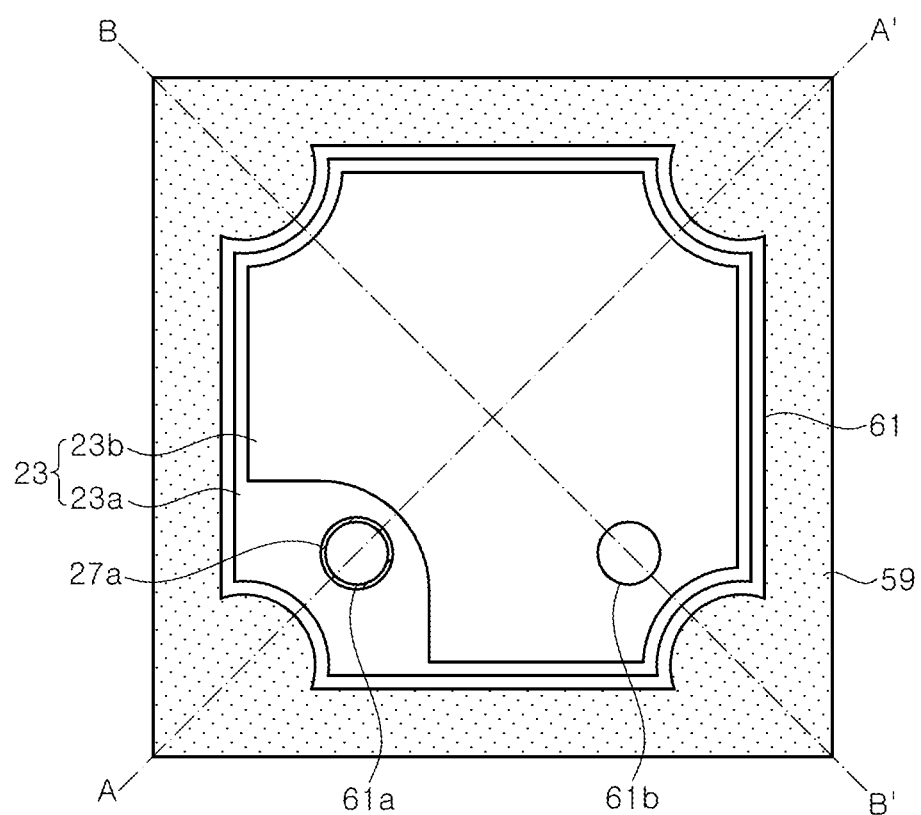
Figure 13B:
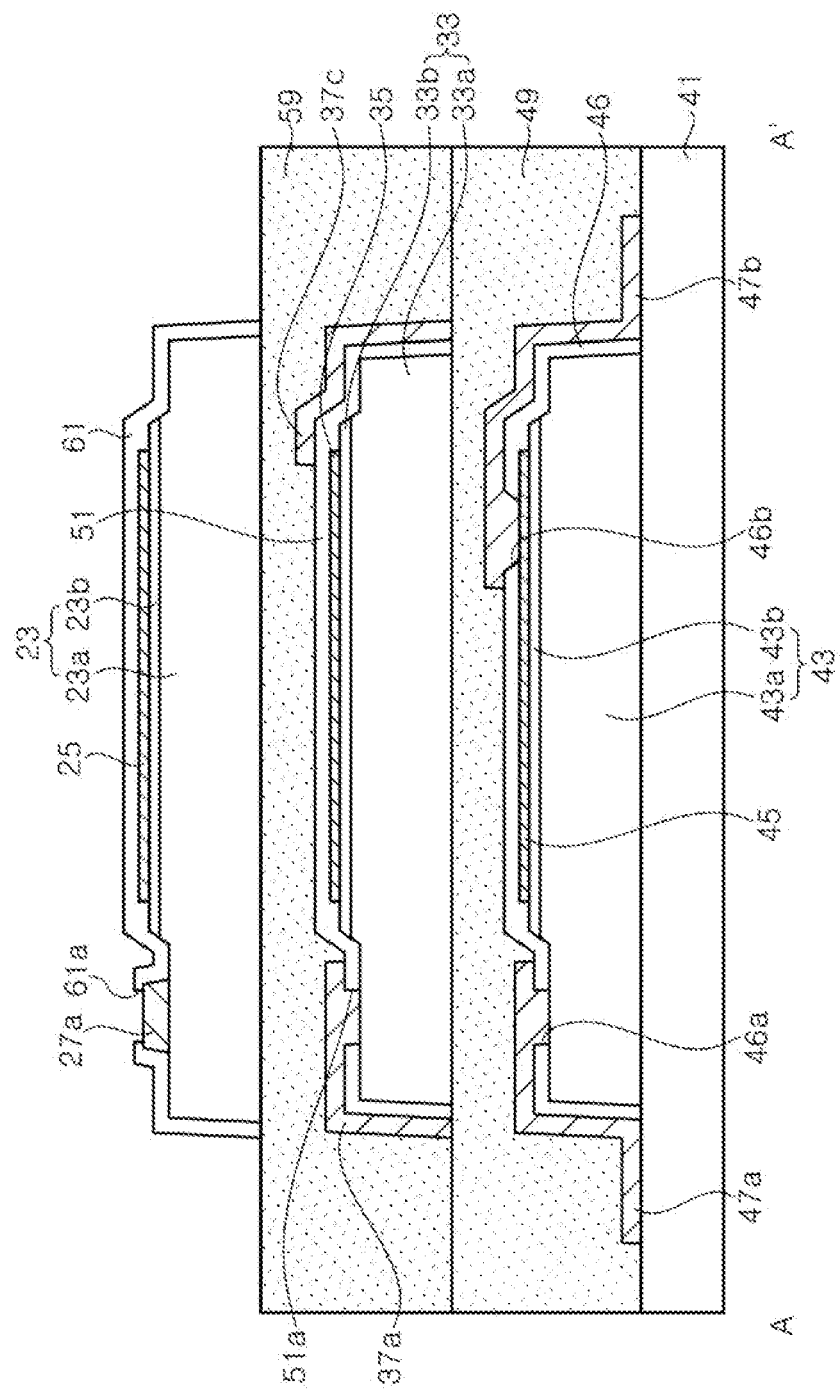
Figure 13C:
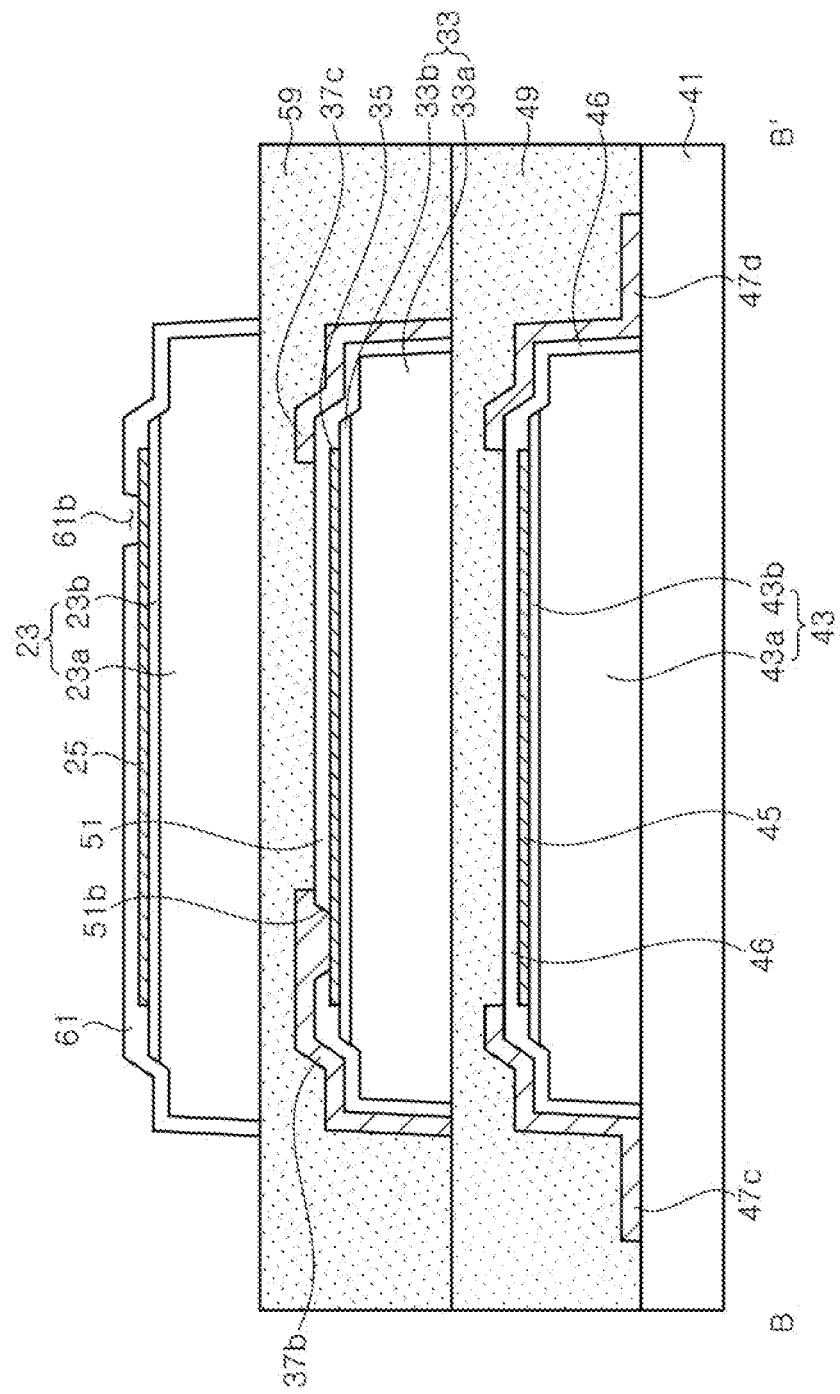

Referring to FIGS. 13A, 13B, and 13C, the device isolation process is carried out so that the first conductivity type semiconductor layer 23a may be defined in the light emitting device region, and the second bonding layer 59 may be exposed around the first LED stack 23.

Subsequently, surface treatment may be carried out on the first LED stack 23 to remove surface defects. The surface of the first LED stack 23 may be treated using, for example, a diluted HF solution or a diluted HCl solution. The surface treatment may be carried out before the device isolation process.

Thereafter, a third insulation layer 61 covering side and upper surfaces of the first LED stack 23 and covering the n-electrode pad 27a is formed. The third insulation layer 61 may be formed using an atomic layer deposition technique, a low pressure chemical vapor deposition technique, or a damage free plasma enhanced chemical vapor deposition technique, and may be formed of, for example, $Al_2O_3$, $SiN_x$, $SiO_2$, or the like.

The third insulation layer 61 may be patterned to have openings 61a and 61b exposing the n-electrode pad 27a and the first ohmic electrode 25. Further, the third insulation layer 61 may be patterned to expose the second bonding layer 59 around the first conductivity type semiconductor layer 23a.

Figure 14A:
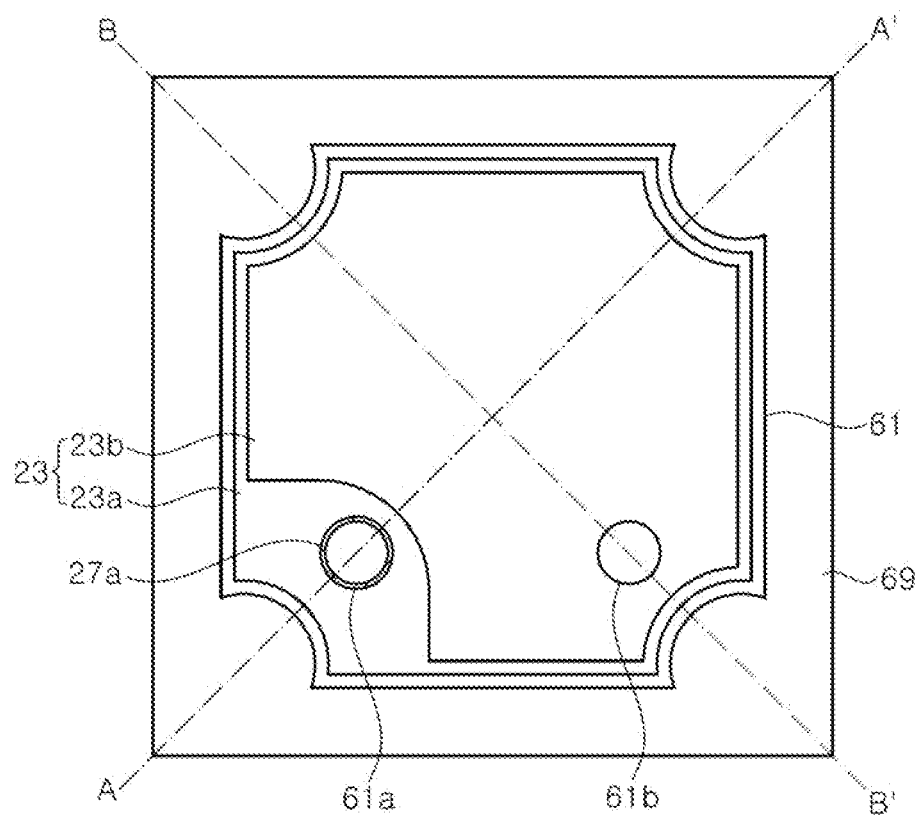
Figure 14B:
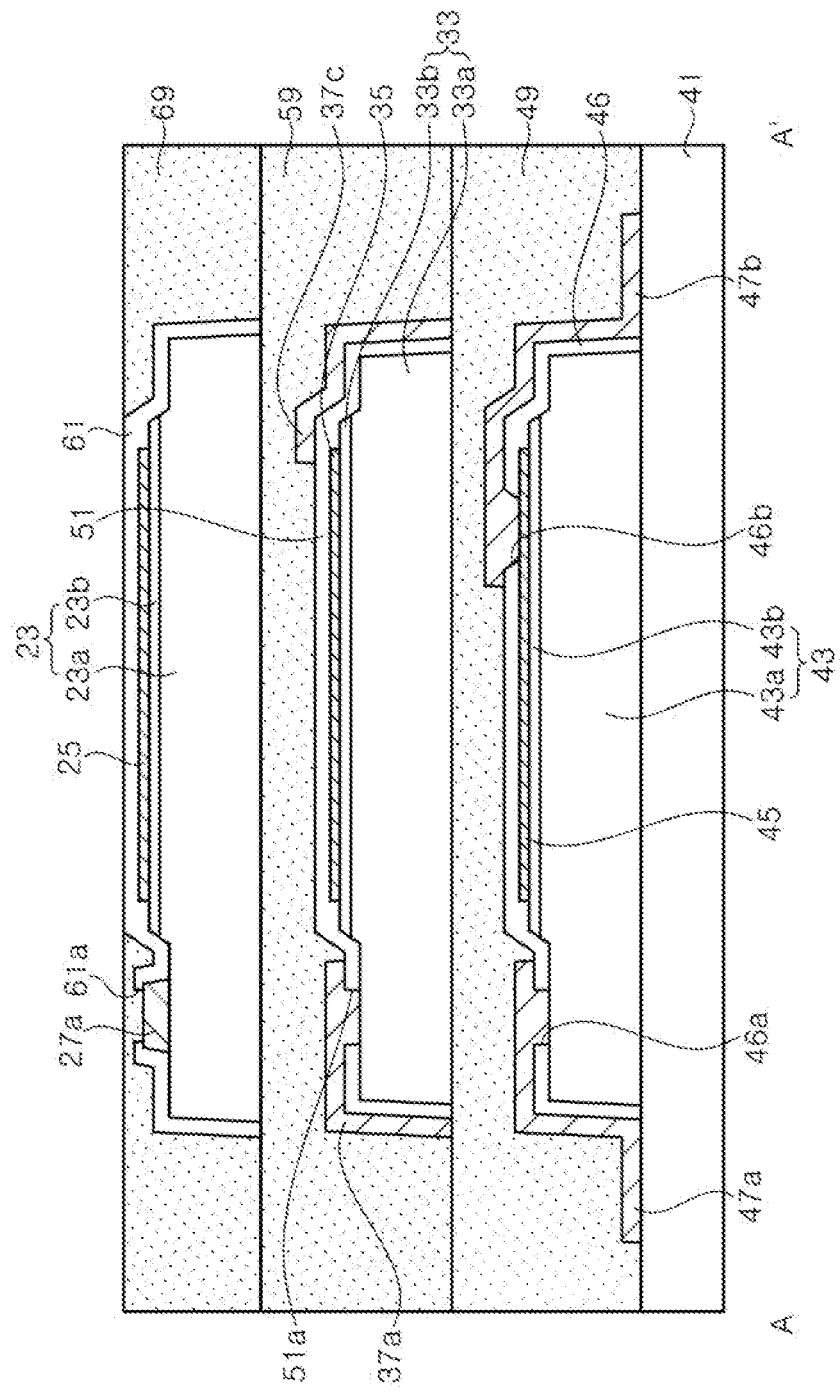
Figure 14C:
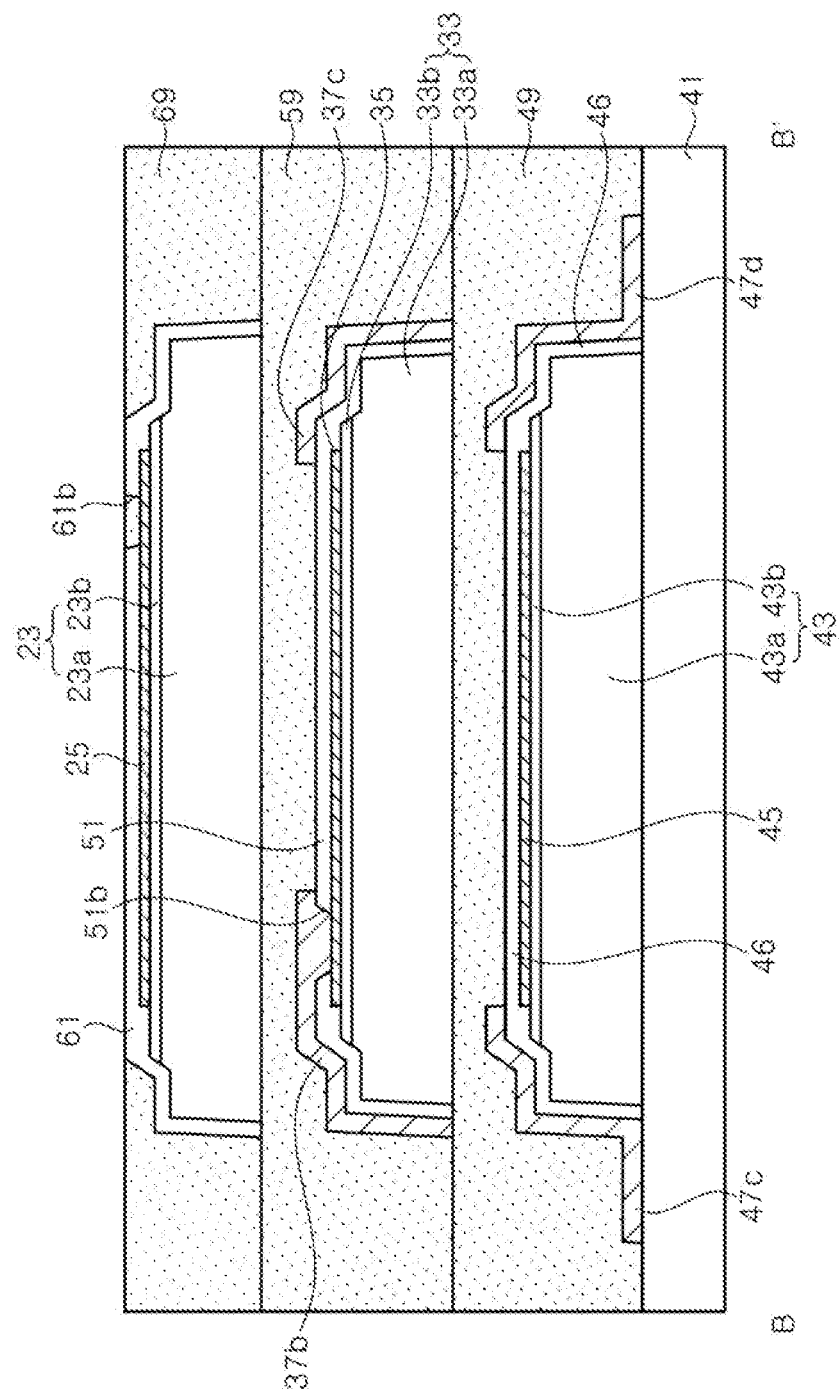

Referring to FIGS. 14A, 14B, and 14C, a planarization layer 69 filling the device isolation region is formed. After the planarization layer 69 is formed to cover the first LED stack 23, the planarization layer 69 may be planarized through an etching back process or a chemical mechanical polishing process. As shown in FIGS. 14B and 14C, an upper surface of the planarization layer 69 may be substantially flush with an upper surface of the third insulation layer 61. However, the inventive concepts are not limited thereto, and in some exemplary embodiments, the planarization layer 69 may cover the third insulation layer 61 and have substantially a flat upper surface.

Figure 15A:
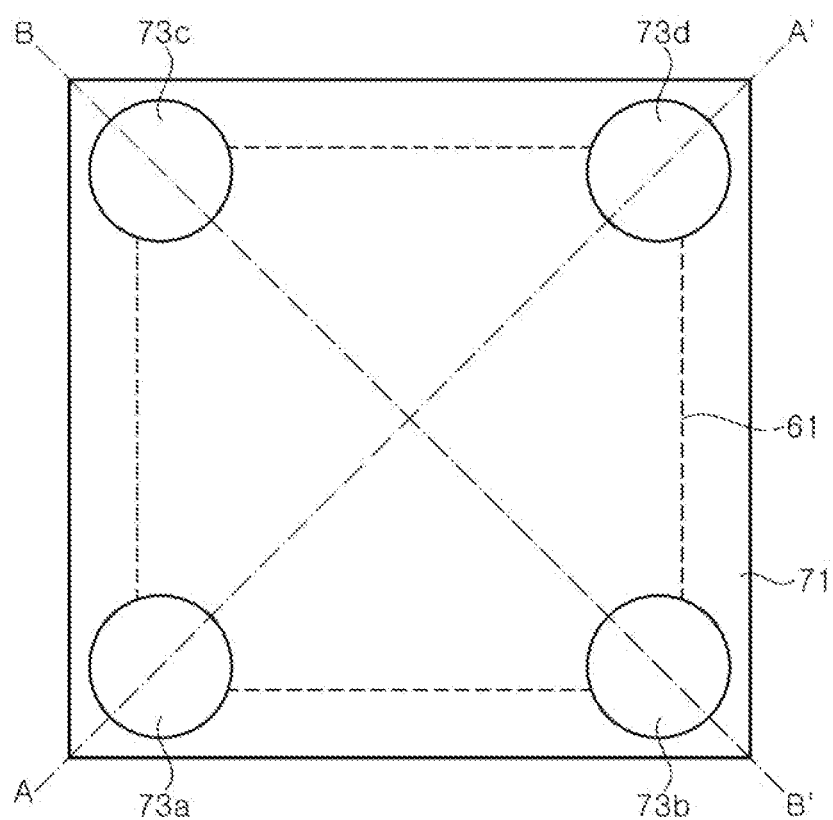
Figure 15B:
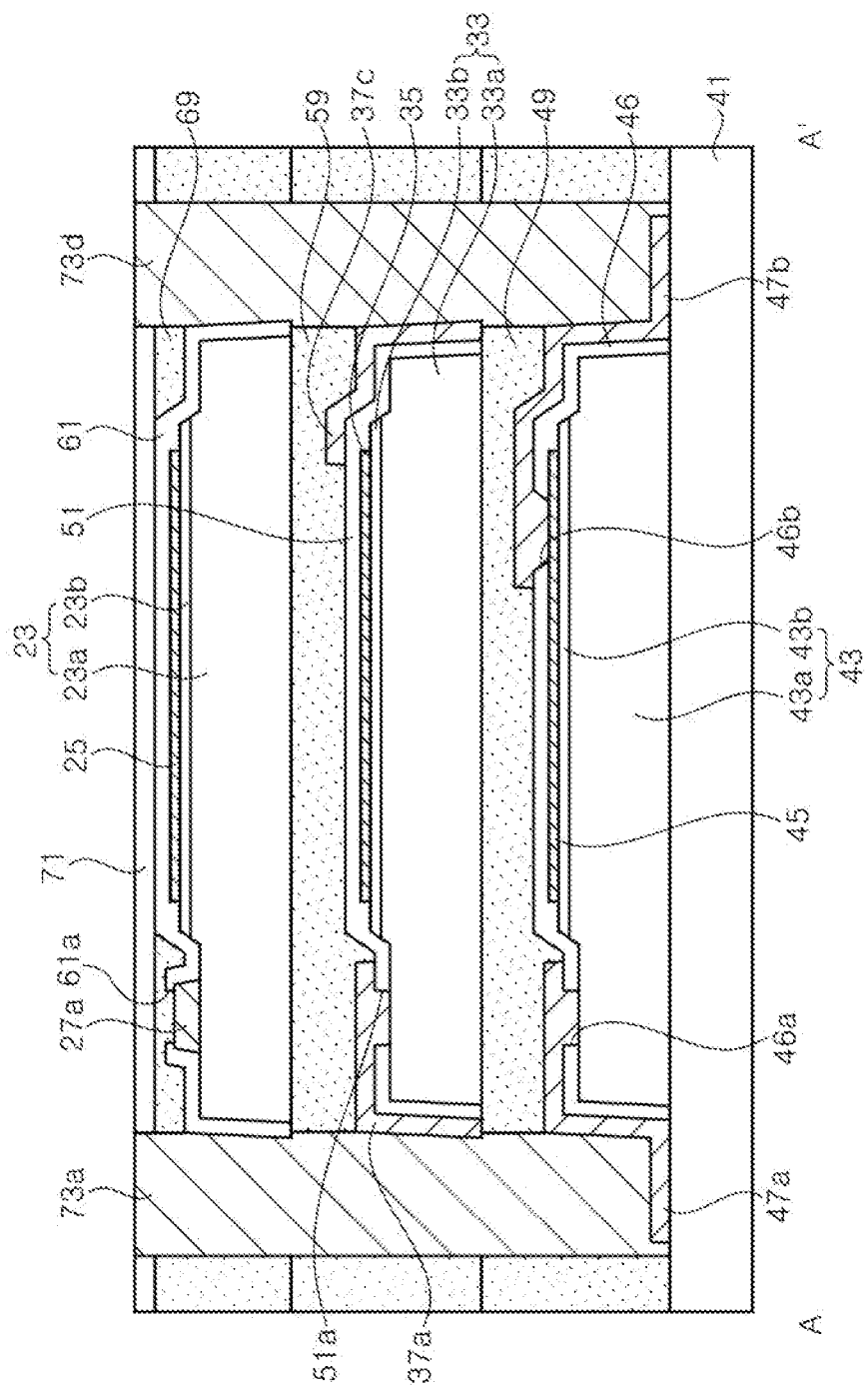
Figure 15C:
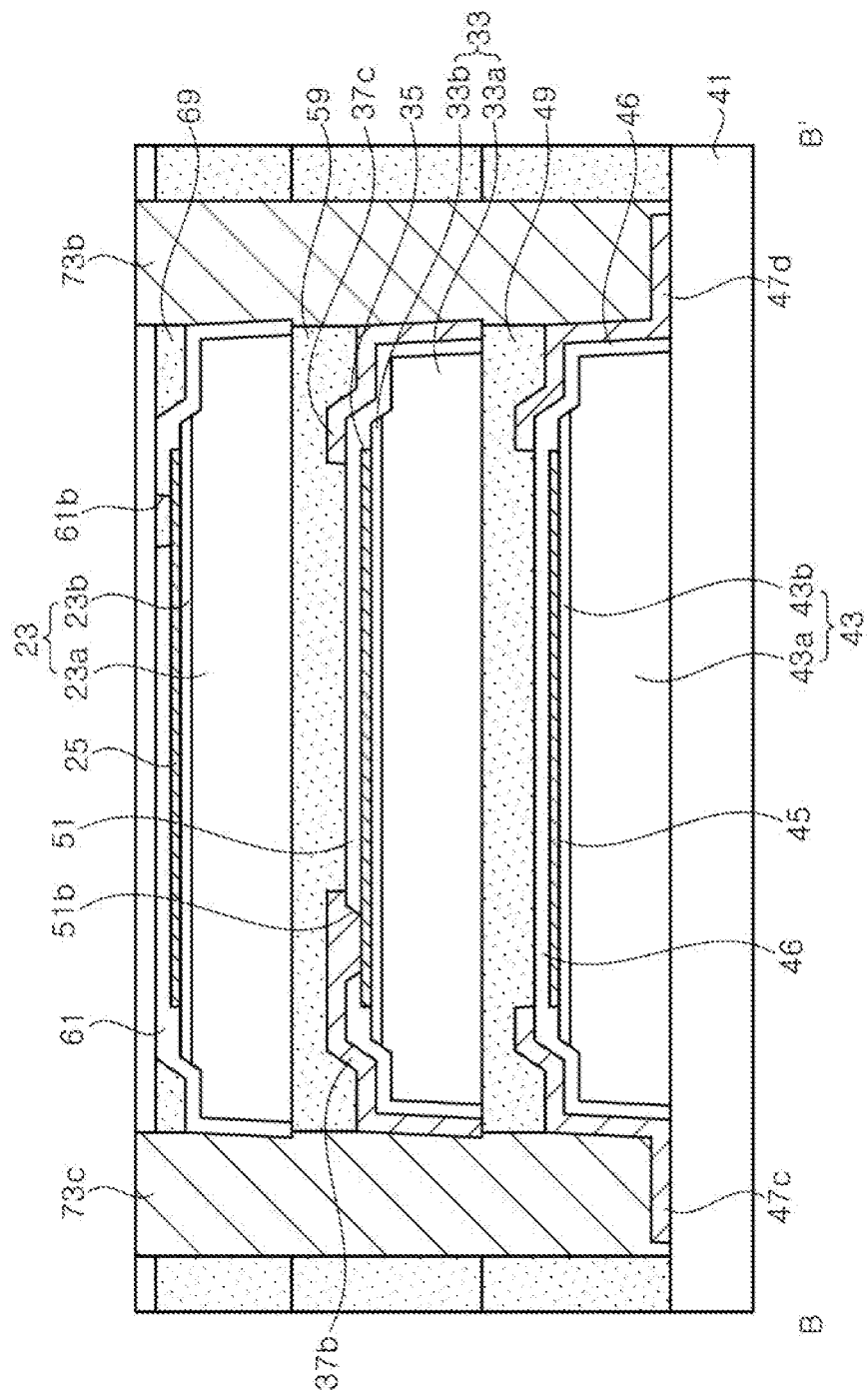

Referring to FIGS. 15A, 15B, and 15C, an upper insulation layer 71 is formed on the planarization layer 69. The upper insulation layer 71 may be used as a hard mask layer. In particular, the upper insulation layer 71 is patterned to form openings exposing the planarization layer 69. Thereafter, openings exposing the lower connectors 47a and 47b and the lower metal layers 47c and 47d are formed by etching the planarization layer 69, the second bonding layer 59, and the first bonding layer 49 using the upper insulation layer 71 as a mask. In these openings, the intermediate connectors 37a and 37b and the intermediate metal layers 37c and 37d may be exposed, and the third insulation layer 61 may also be exposed.

Thereafter, pillars 73a, 73b, 73c, and 73d filling the openings are formed using a seed layer and a plating technique. The seed layer and the plating layer formed on the upper insulation layer 71 may be removed using a chemical mechanical polishing technique. The openings may be filled using, for example, Cu plating.

Figure 16A:
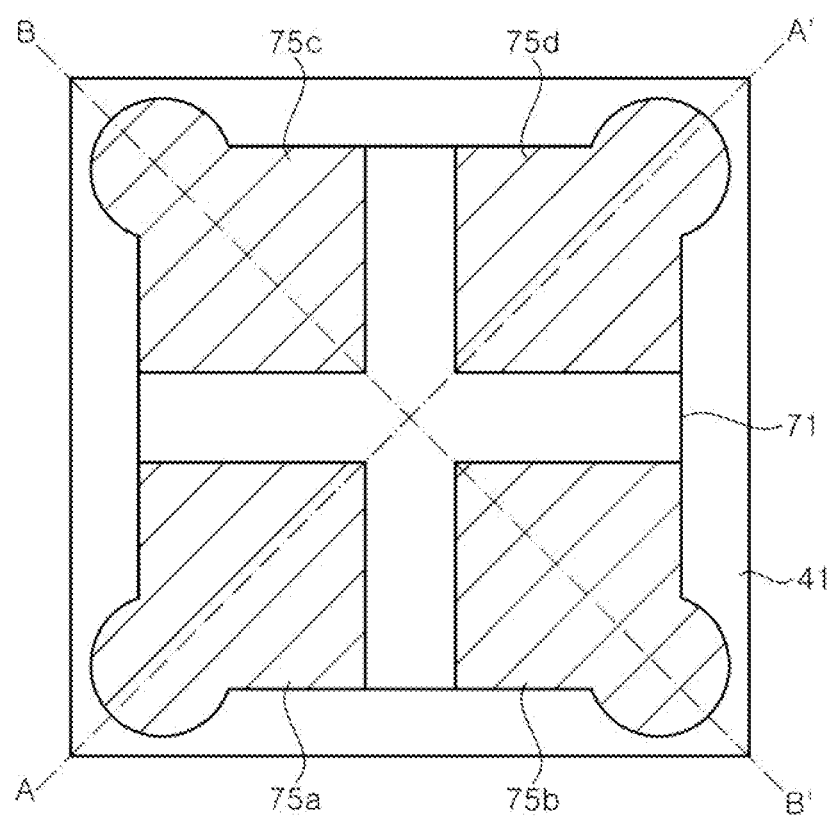
Figure 16B:
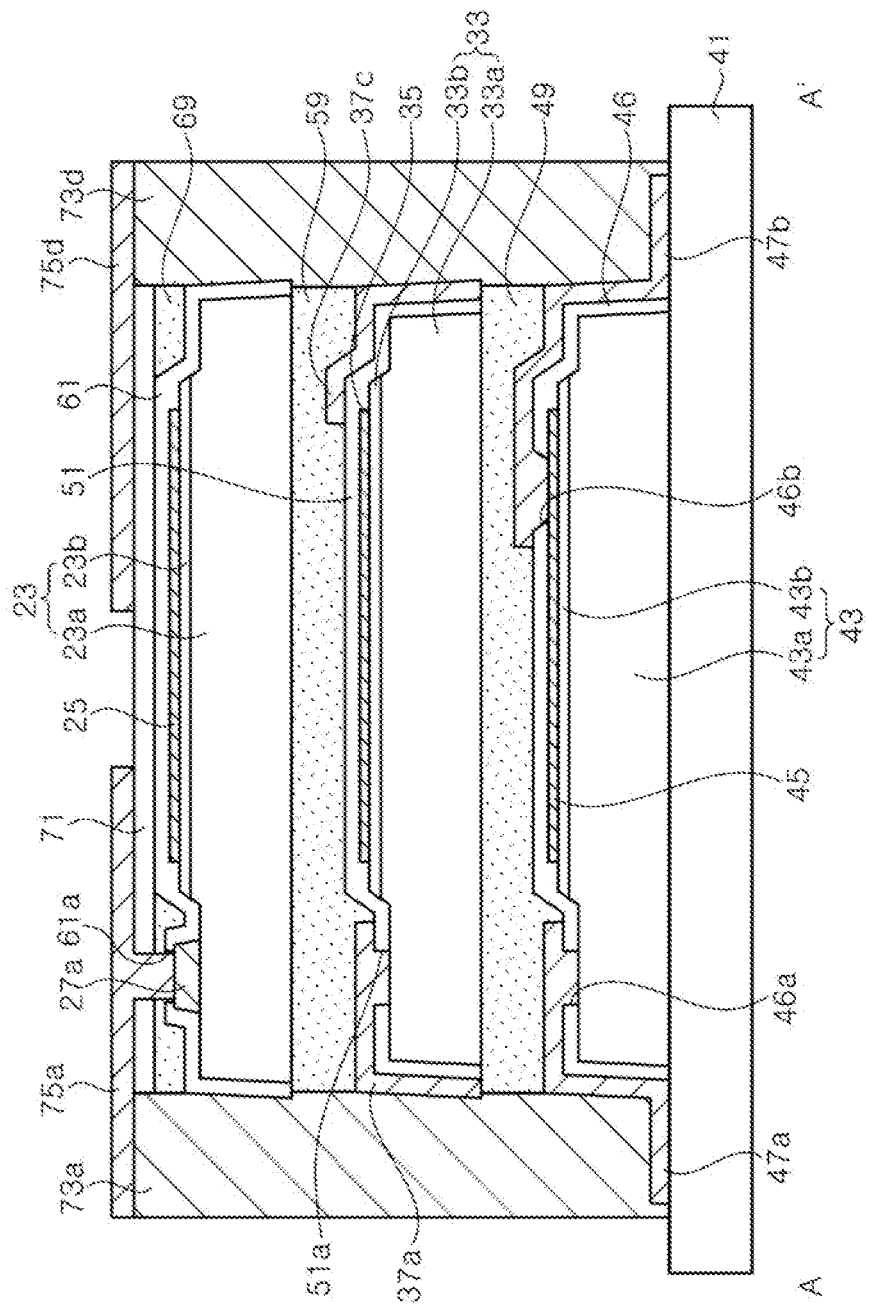
Figure 16C:
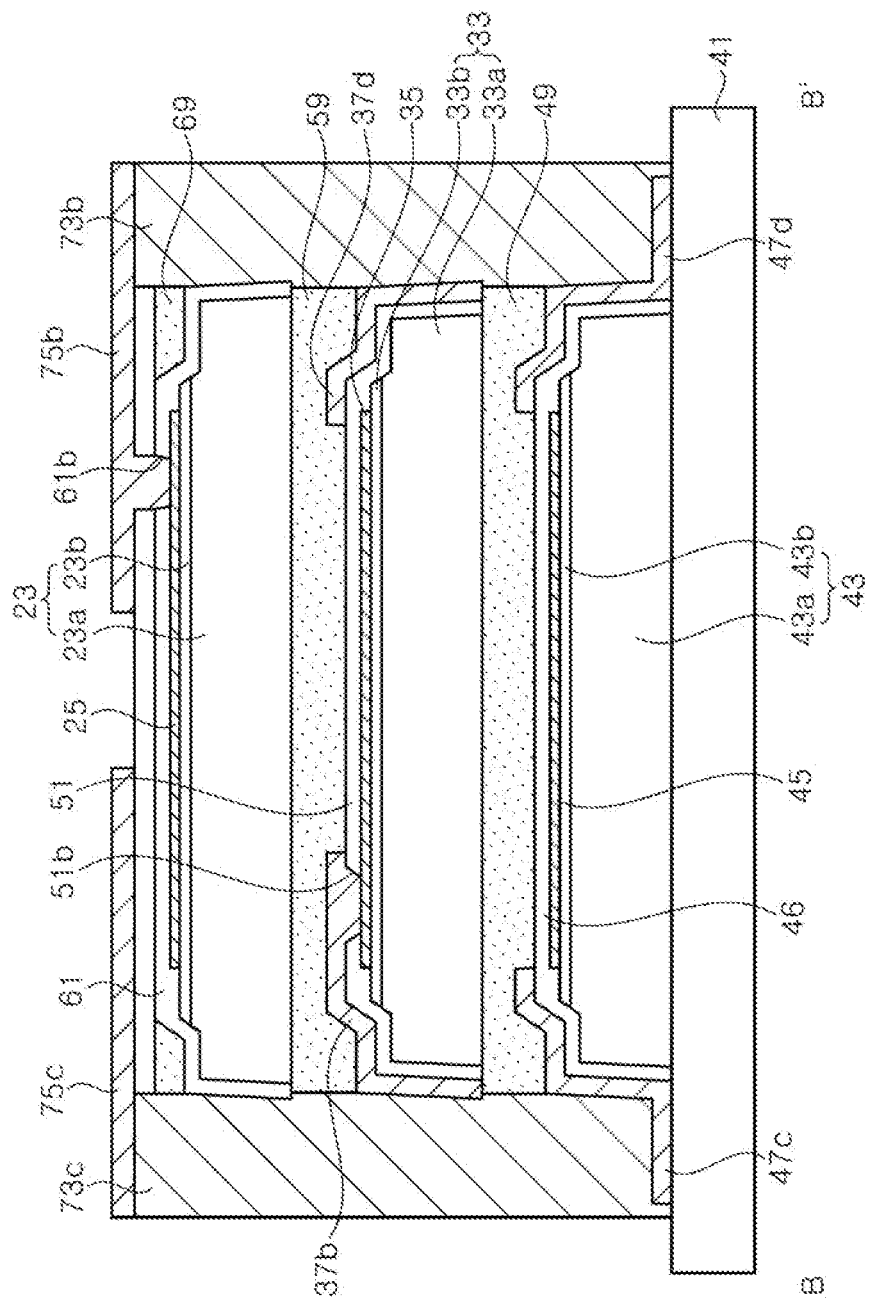

Referring to FIGS. 16A, 16B, and 16C, after the upper insulation layer 71 and the planarization layer 69 are patterned to expose the n-electrode pad 27a and the first ohmic electrode 25, pads 75a, 75b, 75c, and 75d are formed. The upper insulation layer 71 may be removed first. The first pad 75a may electrically connect the first pillar 73a and the n-electrode pad 27a, and the second pad 75b may electrically connect the second pillar 73b and the first ohmic electrode 25. The third pad 75c may be connected to the third pillar 73c, and the fourth pad 75d may be connected to the fourth pillar 73d. The first, second, third, and fourth pads 75a, 75b, 75c, and 75d may cover the first, second, third, and fourth pillars 73a, 73b, 73c, and 73d, respectively, and may also cover an upper region of the first LED stack 23.

Thereafter, the first bonding layer 49, the second bonding layer 59, and the planarization layer 69 around the peripheries of the first, second, third, and fourth pillars 73a, 73b, 73c, and 73d may be removed.

Figure 17A:
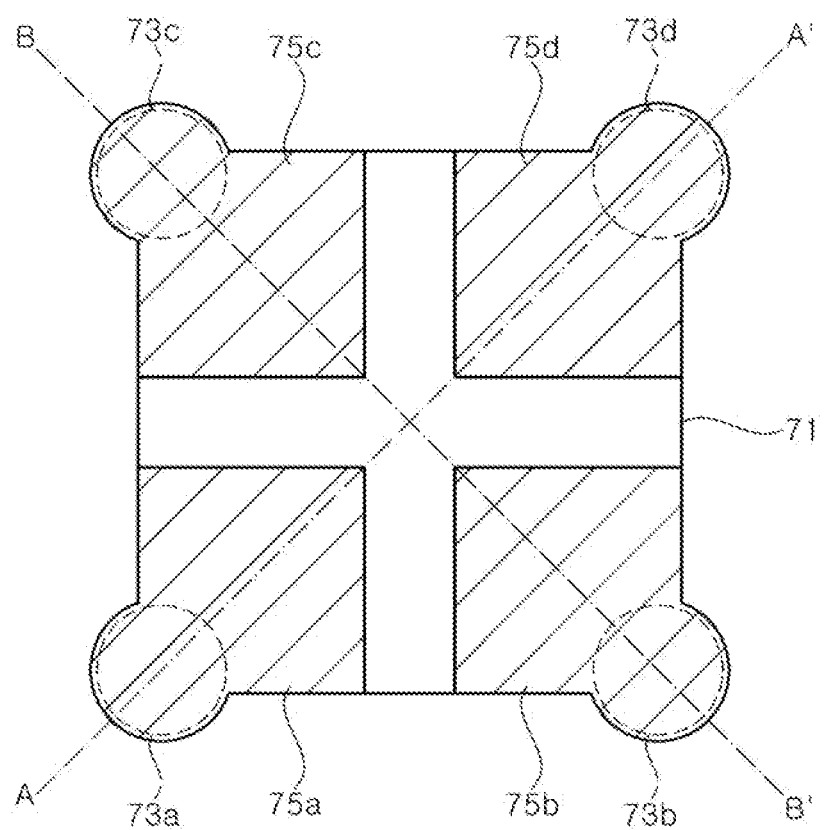
Figure 17B:
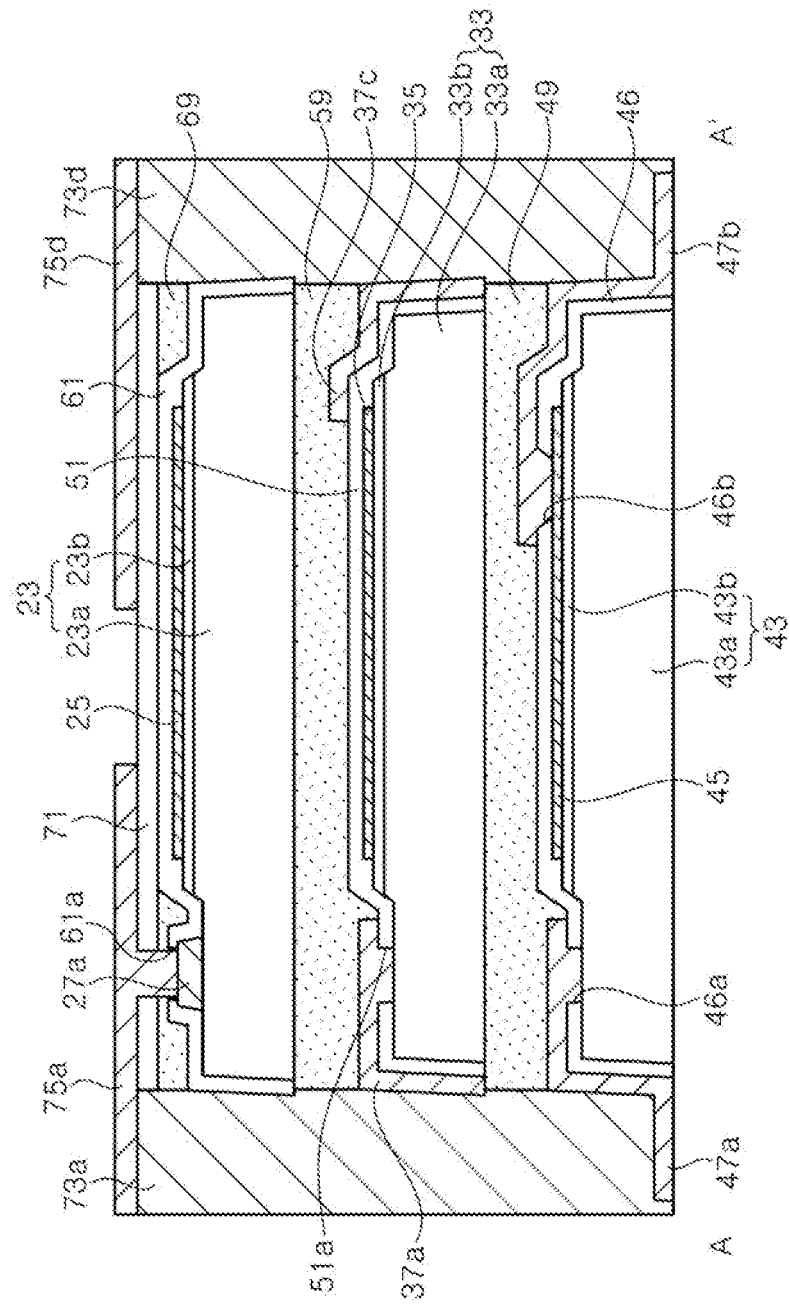
Figure 17C:
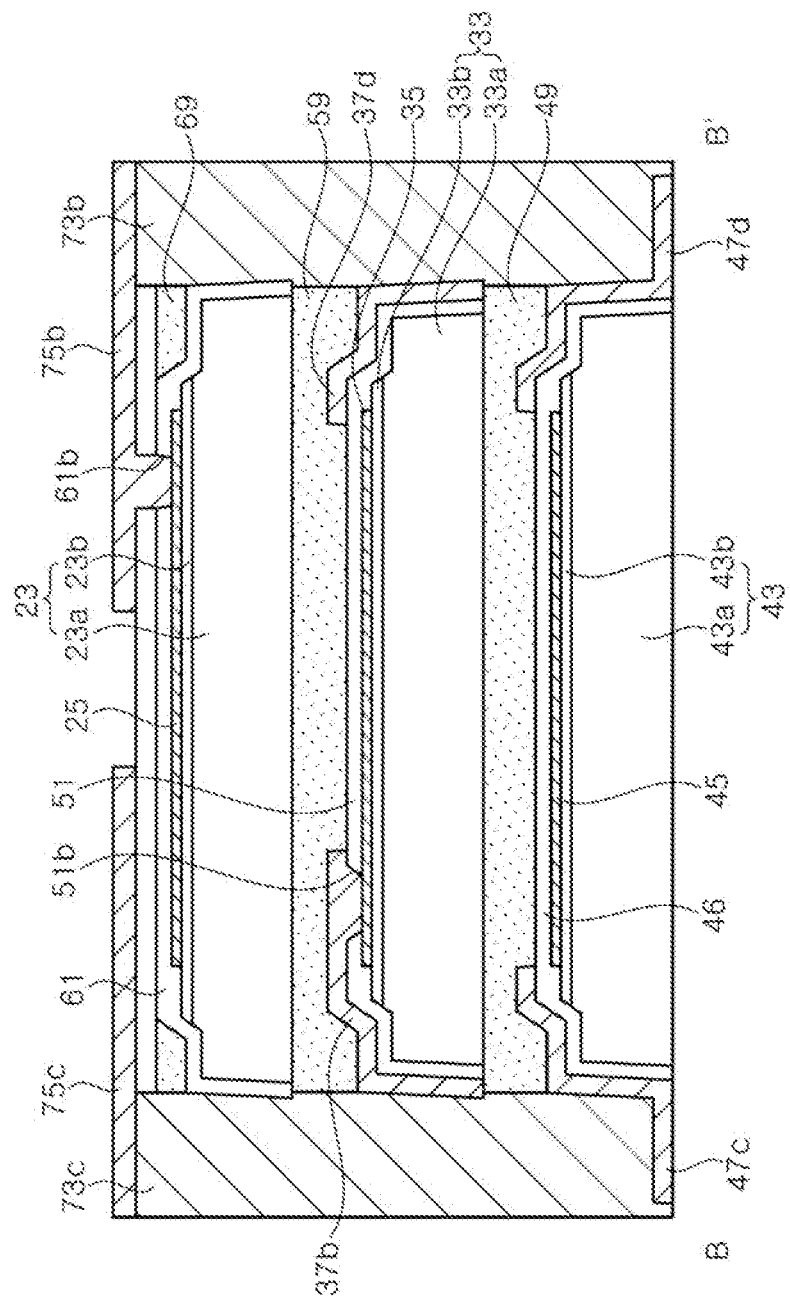

Referring to FIGS. 17A, 17B, and 17C, the substrate 41 is separated from the light emitting device 100. The substrate 41 may be separated from the light emitting device 100 using a laser lift-off technique. In this case, since the lower connectors 47a and 47b and the lower metal layers 47c and 47d include the Cr layer or the Al layer as the lowermost layer, the light emitting device 100 can be easily separated from the substrate 41.

The substrate 41 may be separated in a process of directly transferring the light emitting device 100 to the circuit board (101 in FIG. 2) of the display panel 1000, or in an intermediate process of transferring the light emitting device 100 to another temporary substrate.

Figure 18:
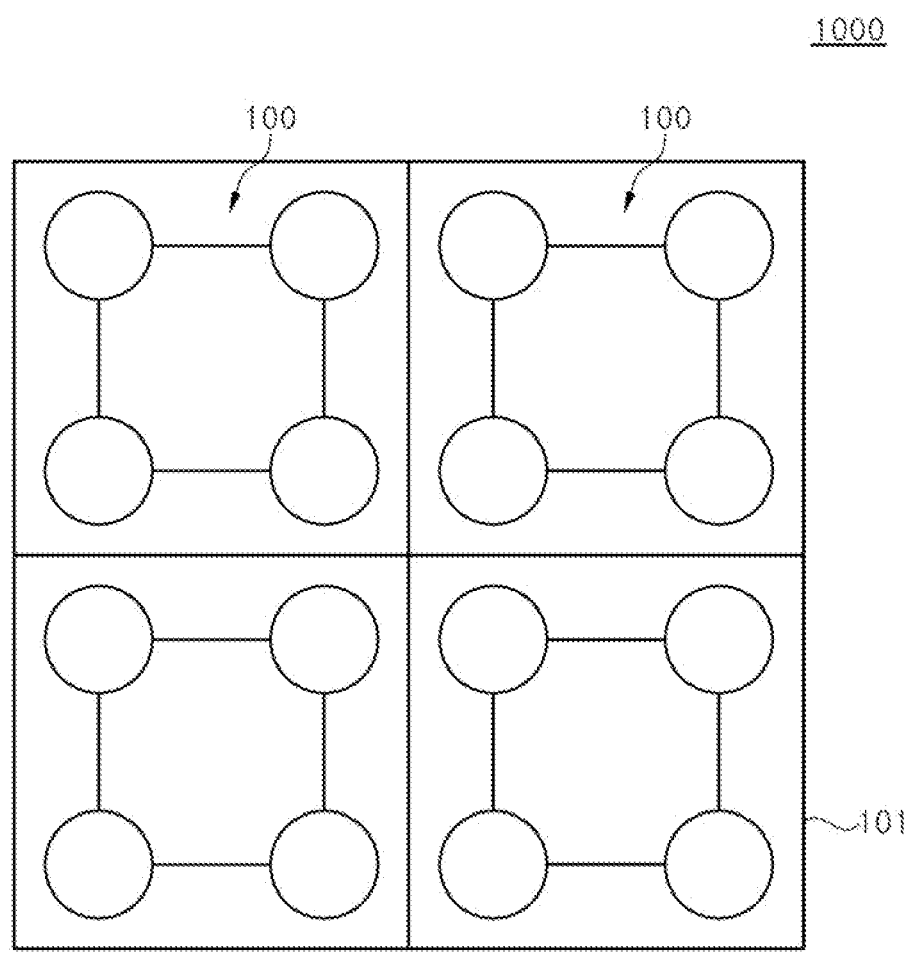
FIG. 18 is a schematic plan view of a display panel including light emitting devices according to an exemplary embodiment.

FIG. 18 is a schematic plan view of a display panel 1000 including light emitting devices 100 according to an exemplary embodiment.

Referring to FIG. 18, each of the light emitting devices 100 is disposed in a pixel region of a circuit board, respectively. The light emitting devices 100 have pillars at four corners, respectively. The light emitting devices 100 may be arranged in a matrix structure, and may be arranged symmetrically. However, the inventive concepts are not limited thereto, and in some exemplary embodiments, the light emitting devices 100 may be arranged in a honeycomb structure or in another form. The light emitting devices 100 may be transferred onto a circuit board 101 using various known techniques.

Figure 19:
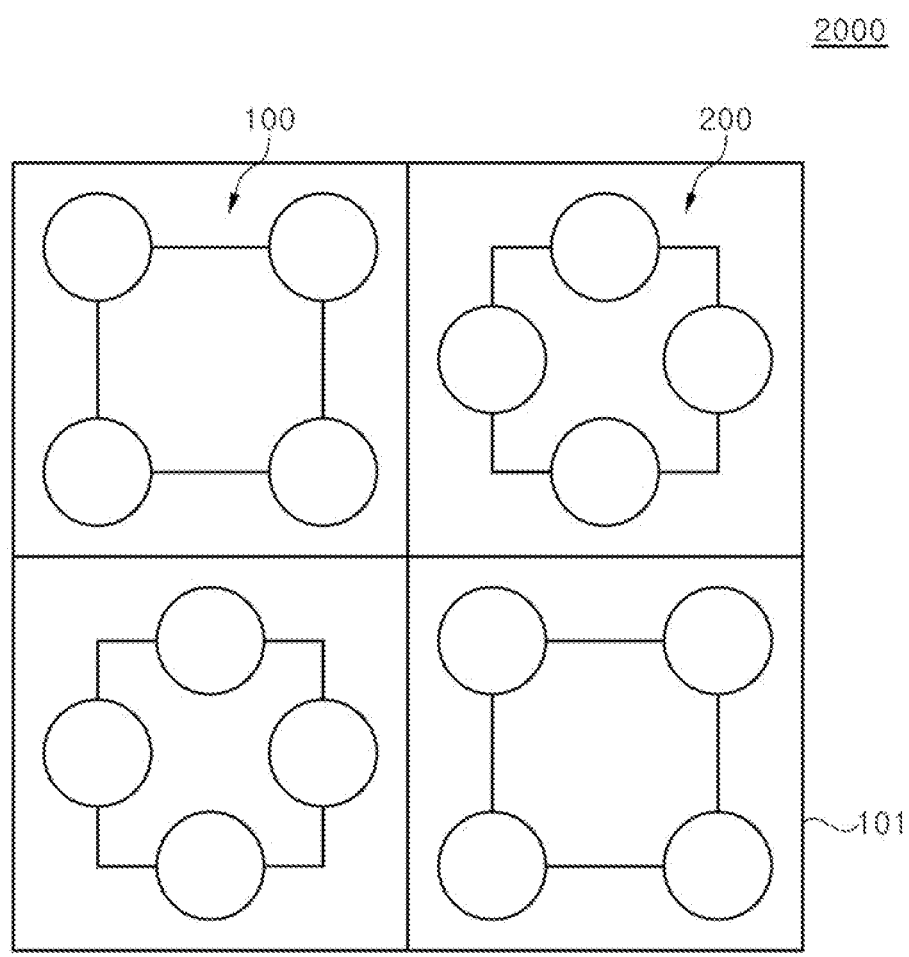
FIG. 19 is a schematic plan view of a display panel including light emitting devices according to another exemplary embodiment.

FIG. 19 is a schematic plan view illustrating a display panel 2000 including light emitting devices 100 and 200 according to another exemplary embodiment.

Referring to FIG. 19, the light emitting devices 100 have pillars near four corners, and the light emitting devices 200 have pillars near four edges. The light emitting devices 200 have substantially the same structure as those of the light emitting devices 100 described in detail above, except for the location of the pillars. As such, repeated descriptions of the light emitting devices 200 will be omitted to avoid redundancy. By arranging the light emitting devices 200 adjacent to each edge of the light emitting device 100, the light emitting device 100 and the light emitting device 200 may be disposed closer to each other, and thus, the light emitting devices 100 and 200 may be arranged more closely.

According to exemplary embodiments, by employing pillars adjacent to side surfaces of the first, second, and third LED stacks as an electrical connection structure, through vias passing through the LED stacks may be omitted. In this manner, reduction in light emitting areas of the LED stacks may be alleviated, which may improve light extraction efficiency by reducing non-radiative recombination occurring on the surfaces of the LED stacks.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting device, comprising:
an insulator;
a light emission region disposed on the insulator, the light emission region including:
a first LED stack configured to emit light having a first wavelength and including a first conductivity type semiconductor layer and a second conductivity type semiconductor layer;
a second LED stack configured to emit light having a second wavelength and including a first conductivity type semiconductor layer and a second conductivity type semiconductor layer; and
a third LED stack configured to emit light having a third wavelength and including a first conductivity type semiconductor layer and a second conductivity type semiconductor layer;
a plurality of pillars, the pillars including:
a first pillar commonly electrically connected to the first conductivity type semiconductor layers of the first, second, and third LED stacks; and
a second pillar, a third pillar, and a fourth pillar electrically connected to the second conductivity type semiconductor layers of the first, second, and third LED stacks, respectively;
an intermediate first connector electrically connecting the first conductivity type semiconductor layer of the second LED stack and the first pillar; and
a lower first connector electrically connecting the first conductivity type semiconductor layer of the third LED stack and the first pillar,
wherein the insulator includes four outer-most side surfaces defining an area within which the first, second, and third LED stacks are disposed, and the first, second, third, and fourth pillars at least partially cover the four outer-most side surfaces of the insulator.

2. The light emitting device of claim 1, further comprising:
an intermediate second connector electrically connected to the second conductivity type semiconductor layer of the second LED stack; and
a lower second connector electrically connecting the second conductivity type semiconductor layer of the third LED stack.

3. The light emitting device of claim 2, wherein the lower first connector and the lower second connector are disposed on the same plane.

4. The light emitting device of claim 1, wherein an upper surface of the lower first connector is disposed at a lower elevation than an upper surface of the second LED stack.

5. The light emitting device of claim 1, wherein the first, second, and third LED stacks overlap each other along a first direction.

6. The light emitting device of claim 1, wherein the light emission region is disposed in an area defined by two pillars facing each other.

7. The light emitting device of claim 1, wherein the first pillar overlaps at least a portion of an upper surface of the lower first connector while exposing an upper surface of the intermediate first connector when viewed in plan.

8. The light emitting device of claim 1, wherein the first pillar overlaps a greater area of the lower first connector than the intermediate first connector when viewed in plan.

9. The light emitting device of claim 1, wherein the insulator overlaps each of the first, second, and third LED stacks.

10. The light emitting device of claim 1, wherein the first pillar has a thickness greater than each of the first, second, and third LED stacks.

11. A light emitting module, comprising:
an insulator;
a light emission region disposed on the insulator, the light emission region including:
a first LED stack configured to emit light having a first wavelength and including a first conductivity type semiconductor layer and a second conductivity type semiconductor layer;
a second LED stack configured to emit light having a second wavelength and including a first conductivity type semiconductor layer and a second conductivity type semiconductor layer; and
a third LED stack configured to emit light having a third wavelength and including a first conductivity type semiconductor layer and a second conductivity type semiconductor layer;
a first pillar commonly electrically connected to the first conductivity type semiconductor layers of the first, second, and third LED stacks;
a second pillar electrically connected to the second conductivity type semiconductor layer of one of the first, second, and third LED stacks;
an intermediate first connector electrically connecting the first conductivity type semiconductor layer of the second LED stack and the first pillar; and
a lower first connector electrically connecting the first conductivity type semiconductor layer of the third LED stack and the first pillar,
wherein the insulator includes four outer-most side surfaces defining an area within which the first, second, and third LED stacks are disposed, and the first and second pillars at least partially cover at least two of the four outer-most side surfaces of the insulator, and
wherein the first pillar overlaps at least a portion of a surface of the lower first connector when viewed in plan or in a cross-sectional view.

12. The light emitting module of claim 11, wherein the first, second, and third LED stacks overlap each other along a first direction.

13. The light emitting module of claim 11, wherein the first pillar overlaps a greater area of the lower first connector than the intermediate first connector when viewed in plan.

14. The light emitting module of claim 11, wherein the first pillar has a thickness greater than each of the first, second, and third LED stacks.

15. The light emitting module of claim 11, wherein the light emitting region is disposed in an area defined by the first and second pillars.

16. A display apparatus, comprising:
an insulation unit;
a light emitting region disposed on the insulation unit and including a first LED stack, a second LED stack, and a third LED stack overlapping each other along a first direction, each of the first, second, and third LED stacks includes a first conductivity type semiconductor layer and a second conductivity type semiconductor layer and is configured to emit light having different wavelengths from each other;
a first pillar commonly electrically connected to the first conductivity type semiconductor layers of the first, second, and third LED stacks;
a second pillar electrically connected to the second conductivity type semiconductor layer of one of the first, second, and third LED stacks;
an intermediate first connector electrically connecting the first conductivity type semiconductor layer of the second LED stack and the first pillar; and
a lower first connector electrically connecting the first conductivity type semiconductor layer of the third LED stack and the first pillar,
wherein the insulation unit includes four outer-most side surfaces defining an area within which the first, second, and third LED stacks are disposed, and the first and second pillars at least partially cover at least two of the four outer-most side surfaces of the insulation unit, and
wherein the intermediate first connector and the lower first connector overlap each other in the first direction.

17. The display apparatus of claim 16, wherein the first pillar overlaps at least a portion of an upper surface of the lower first connector while exposing an upper surface of the intermediate first connector when viewed in plan.

18. The display apparatus of claim 16, wherein the first pillar has a thickness greater than each of the first, second, and third LED stacks.

19. The display apparatus of claim 16, wherein the light emitting region is disposed in an area defined by the first and second pillars.

20. The display apparatus of claim 16, further comprising a third pillar and a fourth pillar electrically connected to the second conductivity type semiconductor layers of the remaining ones of the first, second, and third LED stacks, respectively.

* * * * *